(12) United States Patent
Gibson et al.

(10) Patent No.: US 6,339,539 B1
(45) Date of Patent: Jan. 15, 2002

(54) CONTENT ADDRESSABLE MEMORY HAVING READ/WRITE CAPABILITIES THAT DO NOT INTERRUPT CONTINUOUS SEARCH CYCLES

(75) Inventors: G. F. Randall Gibson; Radu Avramescu, both of Nepean (CA)

(73) Assignee: SiberCore Technologies, Inc. (CA)

( * ) Notice: Subject to any disclaimer, the term of this patent is extended or adjusted under 35 U.S.C. 154(b) by 0 days.

(21) Appl. No.: 09/651,426

(22) Filed: Aug. 30, 2000

Related U.S. Application Data

(60) Provisional application No. 60/153,388, filed on Sep. 10, 1999.

(51) Int. Cl.[7] .............................................. G11C 15/00
(52) U.S. Cl. ................ 365/49; 365/230.03; 365/230.05
(58) Field of Search ............................. 365/49, 230.03, 365/230.05, 189.07

(56) References Cited

U.S. PATENT DOCUMENTS

| | | | |
|---|---|---|---|
| 4,532,606 A | 7/1985 | Phelps | 365/49 |
| 4,559,618 A | 12/1985 | Houseman et al. | 365/49 |
| 4,622,653 A | 11/1986 | McElroy | 365/49 |
| 4,646,271 A | 2/1987 | Uchiyama et al. | 365/49 |
| 4,670,858 A | 6/1987 | Almy | 365/49 |
| 4,723,224 A | 2/1988 | Van Hulett et al. | 365/49 |
| 4,758,982 A | 7/1988 | Price | 364/900 |
| 4,794,559 A | 12/1988 | Greenberger | 365/49 |
| 4,996,666 A | 2/1991 | Duluk, Jr. | 365/49 |
| 5,051,949 A | 9/1991 | Young | 365/49 |
| 5,226,005 A | 7/1993 | Lee et al. | |
| 5,257,220 A | * 10/1993 | Shin et al. | 365/49 |
| 5,319,590 A | 6/1994 | Montoye | 365/49 |
| 5,351,208 A | 9/1994 | Jiang | 365/49 |
| 5,568,415 A | 10/1996 | McLellan et al. | 365/49 |
| 5,608,662 A | 3/1997 | Large et al. | 364/724.01 |
| 5,699,288 A | 12/1997 | Kim et al. | 365/49 |
| 5,784,709 A | 7/1998 | McLellan et al. | 711/207 |
| 5,828,593 A | 10/1998 | Schultz et al. | 365/49 |
| 5,859,791 A | 1/1999 | Schultz et al. | 365/49 |

FOREIGN PATENT DOCUMENTS

| | | |
|---|---|---|
| WO | WO 99/23664 | 5/1999 |

OTHER PUBLICATIONS

Podaima, J. et al., "A Self–Timed Fully–Parallel Content Addressable Queue for Switching Applications", 1999, Database Inspec Online Institute of Electrical Engineers, Stevenage, GB., Abstract.

\* cited by examiner

*Primary Examiner*—Huan Hoang
(74) *Attorney, Agent, or Firm*—Martine & Penilla, LLP

(57) ABSTRACT

A content addressable memory (CAM) is provided. The CAM includes a search port for performing search operations at each clock cycle and a maintenance port for writing and reading data to address locations of the content addressable memory. An interlock signal is also provided and is communicated from the search port to the maintenance port to establish when writing and reading of data is to be performed to the content addressable memory so that the search operations continue uninterrupted at each clock cycle. Preferably, the interlock signal is communicated at an end of a search operation and at a beginning of a search pre-charge operation. The maintenance port is configured to set-up a writing operation at a beginning of a clock cycle and execute the write operation at the end of the search operation and the beginning of the search pre-charge operation. In another preferred example, search operations can be deselected at any time, yet any desired writing and reading operation can still be executed. At anytime therefore, the search operations can resume operation at each cycle, without being affected by a read or write operation.

27 Claims, 19 Drawing Sheets

|     | RESET | WRITE | READ |
|-----|-------|-------|------|
| rst | 1     | 0     | 0    |
| wd  | 0     | 1     | 0    |
| rd  | 0     | 0     | 1    |
| wv  | 0     | 1     | 0    |
| rv  | 0     | 0     | 1    |

CONTENT ADDRESSABLE MEMORY HAVING READ/WRITE CAPABILITIES THAT DO NOT INTERRUPT CONTINUOUS SEARCH CYCLES

CROSS REFERENCE TO RELATED APPLICATIONS

This application claims priority from U.S. Provisional Patent Application No. 60/153,388 filed Sep. 10, 1999, and entitled "Content Addressable Memory Circuitry." This provisional application is incorporated herein by reference.

BACKGROUND OF THE INVENTION

1. Field of the Invention

The present invention relates generally to memory circuits, and more particularly to content addressable memory (CAM) circuits having a continuous search function.

2. Description of the Related Art

Modern computer systems and computer networks utilize memory devices for storing data and providing fast access to the data stored therein. A content addressable memory (CAM) is a special type of memory device often used for performing fast address searches. For example, Internet routers often include a CAM for searching the address of specified data. Thus, the use of CAMs allow routers to perform address searches to facilitate more efficient communication between computer systems over computer networks. Besides routers, CAMs are also utilized in other areas such as databases, network adapters, image processing, voice recognition applications, etc.

Conventional CAMs typically include a two-dimensional row and column content addressable memory core array of cells. In such an array, each row typically contains an address, pointer, or bit pattern entry. In this configuration, a CAM may perform "read" and "write" operations at specific addresses as is done in conventional random access memories (RAMs). However, unlike RAMs, data "search" operations that simultaneously compare a bit pattern of data against an entire list (i.e., column) of pre-stored entries (i.e., rows) can only be performed by CAMs.

FIG. 1A shows a simplified block diagram of a conventional CAM 10. The CAM 10 includes a data bus 12 for communicating data, an instruction bus 14 for transmitting instructions associated with an operation to be performed, and an output bus 16 for outputting a result of the operation. For example, in a search operation, the CAM 10 may output a result in the form of an address, pointer, or bit pattern corresponding to an entry that matches the input data.

Although conventional CAMs are becoming more powerful in their ability to perform searches more rapidly, conventional CAMs suffer in that search operations must be stopped in order to allow for maintenance operations (e.g., read and write operations) on the CAM memory. As a result, even the fastest CAMs must stop their search operations for one or more cycles until the maintenance operations are complete.

In view of the foregoing, what is needed is CAM circuitry that enables continuous searching while also enabling maintenance operations to set up the CAM core for future searches.

SUMMARY OF THE INVENTION

The present invention fills this need by providing a content addressable memory (CAM) architecture having a separate search port and a maintenance port, the search port being configured to perform uninterrupted searches on each cycle and the maintenance port being configured to perform maintenance operations without interrupting the searches. It should be appreciated that the present invention can be implemented in numerous ways, including as a process, an apparatus, a system, a device, or a method. Several embodiments of the present invention are described below.

In one embodiment, a content addressable memory (CAM) is disclosed. The CAM includes a search port for performing search operations at each clock cycle and a maintenance port for writing and reading data to address locations of the content addressable memory. An interlock signal is also provided and is communicated from the search port to the maintenance port to establish when writing and reading of data is to be performed to the content addressable memory so that the search operations continue uninterrupted at each clock cycle. Preferably, the interlock signal is communicated at an end of a search operation and at a beginning of a search pre-charge operation. The maintenance port is configured to set-up a writing operation at a beginning of a clock cycle and execute the write operation at the end of the search operation and the beginning of the search pre-charge (or recovery) operation. Another preferred aspect of this embodiment is that search operations can be deselected at any time, yet any desired writing and reading operation can still be executed. At anytime therefore, the search operations can resume operation at each cycle, without being affected by a read or write operation.

In another embodiment, a two port content addressable memory (CAM) is disclosed. The two port CAM includes a maintenance port and a search port. Further included is a plurality of sub-block memory columns being defined between the maintenance port and the search port. An interlock signal is also provided to communicate interlock signals from the search port to the maintenance port to signal when reads and writes are to be performed by the maintenance port without interrupting the search port from executing a search operation on every clock cycle during a desired search operation. Preferably, the interlock signal is communicated at an end of a search operation and at a beginning of a search pre-charge operation. In another preferred feature, the maintenance port is configured to set-up a writing operation at a beginning of a clock cycle and execute the write operation at the end of the search operation and the beginning of the search pre-charge operation.

In yet another embodiment, a content addressable memory chip is disclosed. The chip includes: (a) a first macro including a first set of 8 cores; (b) a second macro including a second set of 8 cores; (c) a first maintenance port integrated to a first side of the first set of 8 cores; (d) a second maintenance port integrated to a first side of the second set of 8 cores; (e) a first search port integrated to a second side of the first set of 8 cores; (f) a second search port integrated to a second side of the second set of 8 cores; (g) a first set of 8 interlock signals, and (h) a second set of 8 interlock signals.

One of the first set of 8 interlock signals is provided for each core of the first set of 8 cores, the first set of 8 interlock signals is integrated from the first search port to the first maintenance port to signal when reads and writes are to be performed to selected ones of the first set of 8 cores, and the reads and writes are configured to be performed without interrupting consecutive searches by the first search port. Similarly, one of the second set of 8 interlock signals is provided for each core of the second set of 8 cores, the second set of 8 interlock signals is integrated from the second search port to the second maintenance port to signal when reads and writes are to be performed to selected ones of the second set of 8 cores, and the reads and writes configured to be performed without interrupting consecutive searches by the second search port.

In still another embodiment, a content addressable memory is disclosed. The content addressable memory includes a search port for performing search operations. A maintenance port for writing and reading data to address locations of the content addressable memory is also provided. An interlock signal is configured to be communicated from the search port to the maintenance port to establish when writing and reading of data is to be performed to the content addressable memory without interrupting search operations that can be triggered at each clock cycle.

The advantages of the present invention are numerous. Most notably, the search port of the present invention is configured to perform continuous searches on each cycle and the maintenance port is configured to perform writes, reads, resets and other maintenance operations without disturbing the search operations. In a preferred embodiment, the search port is configured to communicate an interlock signal to indicate when search operations have been completed and to indicate when reads or writes are to be performed. Preferably, the maintenance operations are performed during the pre-charge of a search operation. Therefore, even though the maintenance port receives interlock signals from the search port, the maintenance port and the search port operate independently and in parallel with one another.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 4A-1 and 4A-2 illustrates embodiments of a portion of the maintenance port and simplified versions of a sub-block, in accordance with one embodiment of the present invention.

FIGS. 4B-1 and 4B-2 are flowcharts defining exemplary method operations performed during write operations and search operations, in accordance with embodiments of the present invention.

FIGS. 5A-1 and 5A-2 are flowchart diagrams illustrating method operations performed during read operations by way of the maintenance port and continuous search operations by way of the search port, in accordance with embodiments of the present invention.

DETAILED DESCRIPTION OF THE PREFERRED EMBODIMENTS

An invention for CAM circuitry is provided. The CAM circuitry is optimized with logic for enabling fast searches to occur in every clock cycle (if desired) and also allowing maintenance operations (e.g., writes and reads) to be performed. The maintenance operations are preferably executed with coordination from the search port, e.g., by a timing interlock signal, so that search speed is not compromised. The efficiency and intelligence provided by the CAM circuitry therefore facilitates efficient data processing in search dependent technologies, such as network and Internet communication systems. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
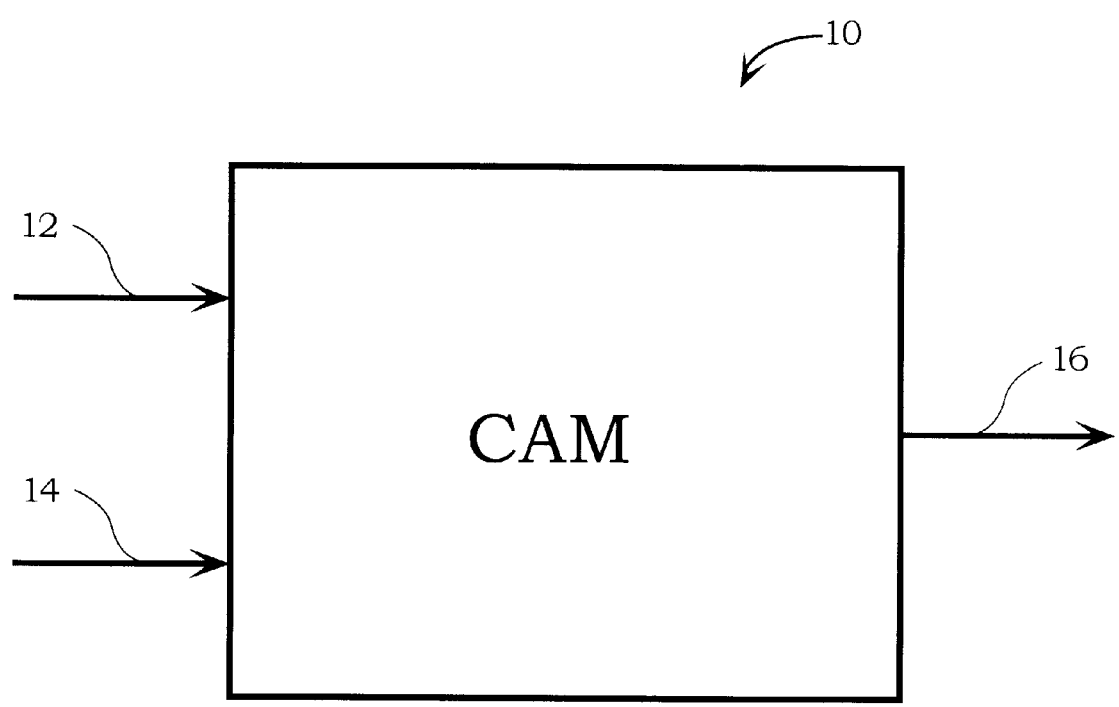
FIG. 1A shows a simplified block diagram of a conventional CAM.
Figure 2:
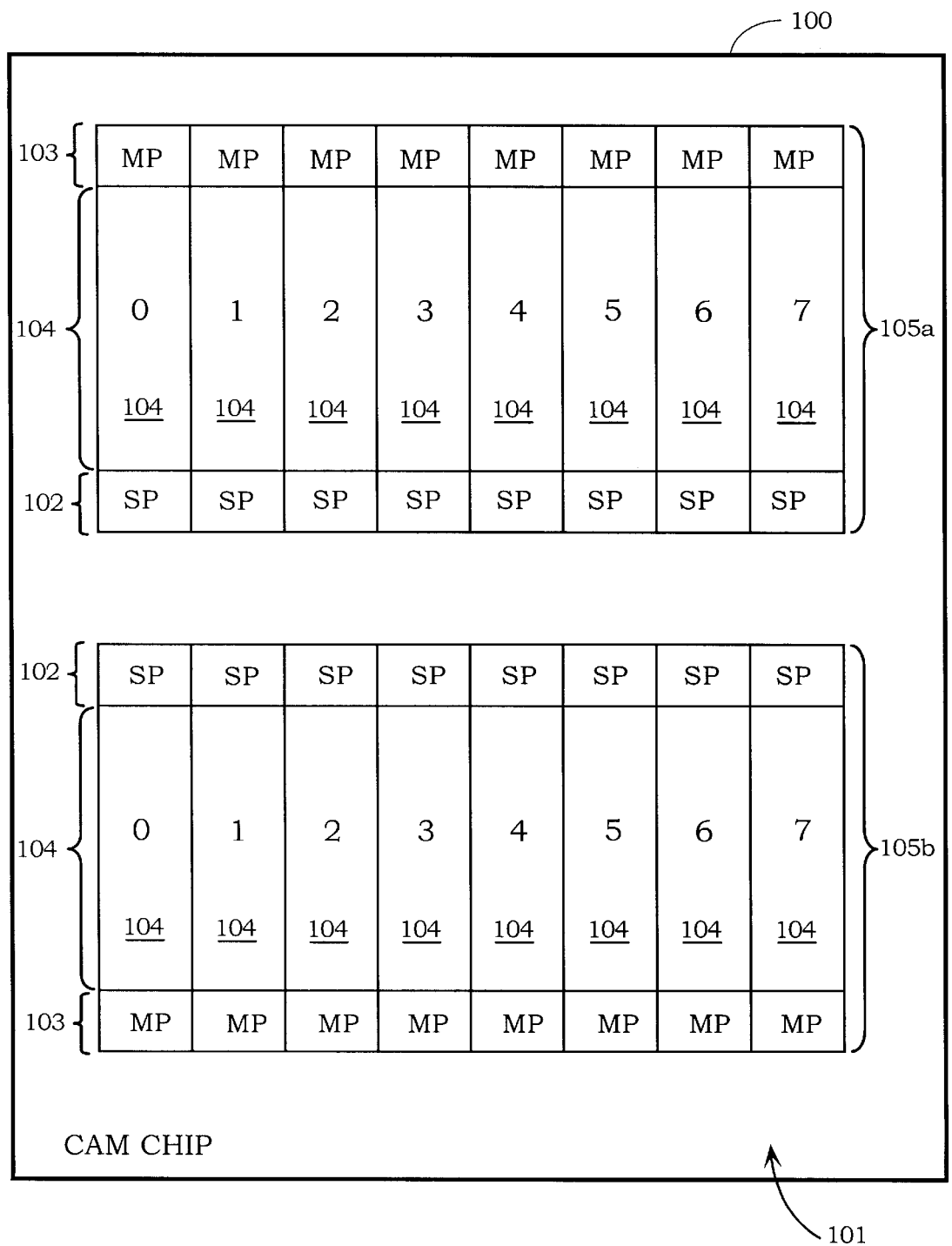
FIG. 2 illustrates a CAM chip including two macros, in accordance with one embodiment of the present invention.

FIG. 2 illustrates a CAM chip 100 including two macros 105a and 105b, in accordance with one embodiment of the present invention. A chip can, in other embodiments, include one or more macros 105 depending on the application. Each macro 105 is shown including a plurality of cores 104, and each core 104 is accompanied by its associated maintenance port (MP) 103 and search port (SP) 102. In this example, the CAM chip 100 has macros 105 that include eight cores each. Thus, each core is a two-port core having its associated MP 103 and SP 102. The search ports 102 are configured to incorporate circuitry for performing searches in the memory of each of the cores 104, and the maintenance ports 103 assist in performing write operations, read operations, and other maintenance-related operations to each of the associated cores 104.

Figure 3:
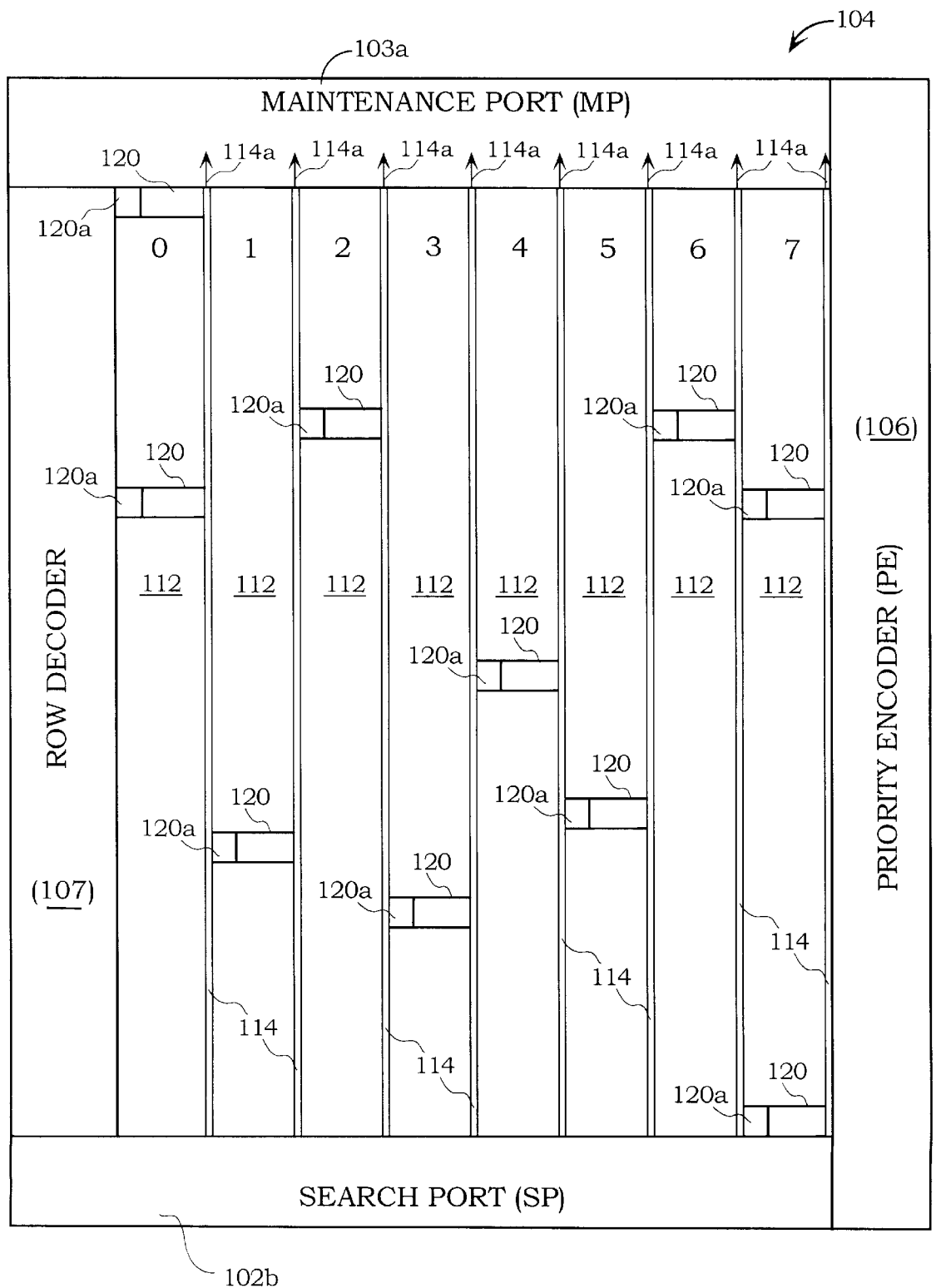
FIG. 3 illustrates a single core that incorporates its own maintenance port and its own search port, in accordance with one embodiment of the present invention.

FIG. 3 illustrates a single core 104 that incorporates its own maintenance port 103a and its own search port 102b. Each core 104 will in turn, include a plurality of sub-blocks 112. In this example, the core 104 will have eight sub-blocks 112, and each sub-block 112 has a width to hold a 32-bit word, and extends to form a column of 512 rows. It should be understood that the actual "word" width and rows of a sub-block can vary depending on the desired application.

The core 104 will also include a row decoder 107 and a priority encoder (PE) 106. As is well known, the priority encoder 106 is configured to prioritize which match of potentially many matches has the highest priority and thus, is most likely to be the address for the data being searched. Each of the words 120 will also have an associated valid bit 120a that is used to either validate the data or invalidate the data, depending upon the particular search being performed. The functionality of the valid bit 120a will be described in greater detail with reference to FIGS. 6A and 6B below.

The maintenance port 103a will thus be configured to enable the reading and writing to the addresses selected from the sub-blocks 112 in order to modify and update the contents of the memory for subsequent search operations. In one embodiment of the present invention, the search operations being performed by way of the search port 102b can be performed continuously one during each clock cycle of operation. In order to perform maintenance operations by way of the maintenance port 103a, the search port 102b is configured to provide the maintenance port 103a an interlock signal 114a. Interlock signal 114a is provided by way of control and timing circuitry 114 that extends along the columns of the core 104. The interlock signal 114a can, in other embodiments, be communicated over any path. That is, the path can be communicated from the search port to the maintenance port from outside of the chip, through other circuitry or blocks of the same chip, and the like. Thus, the actual path is not critical so long as its function is accomplished.

In a preferred embodiment, the maintenance port operations are performed independently from the search port 102b operations and coordinated such that searches continue uninterrupted by way of the search port 102b, and maintenance port 103a operations are performed in between search operations. The maintenance port 103a will be informed of appropriate times to perform the maintenance port operations by way of the interlock signal 114a. For instance, when a write operation is desired by way of the maintenance port 103a, the write operation will begin to set up when the search operation begins. When the search operation times out, the write operation occurs before the next search cycle begins.

The maintenance port 103a preferably includes a Z decoder that enables only one word in a selected sub-block 112 at one time. To accomplish this, a logical AND is performed between a global wordline and a Z decode line. By the implementation of a Z decode, it is possible to access only one word during a read or write operation. The implementation of a Z decode is also referred to as a divided wordline implementation.

Figures 1, 4A:
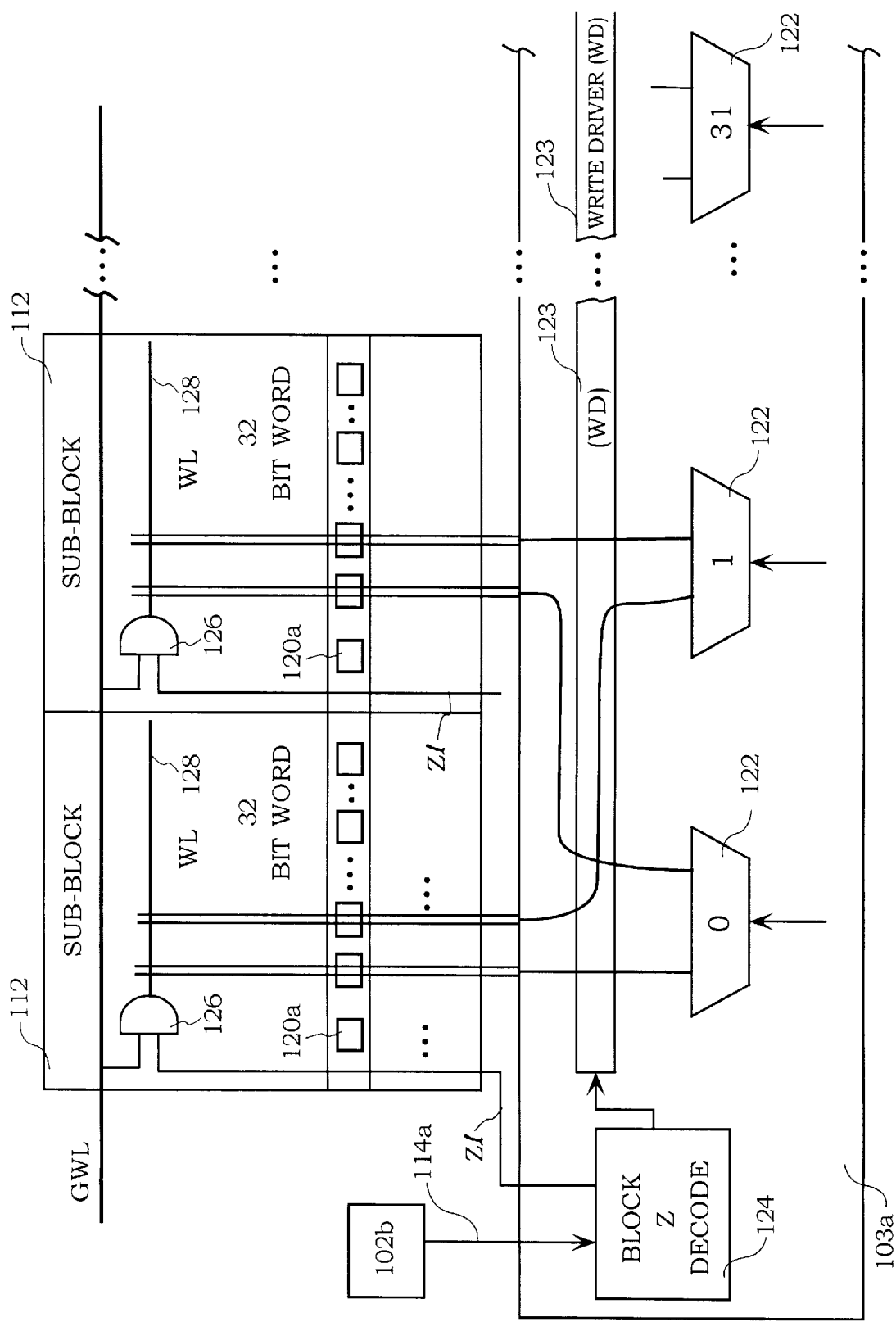
Figures 2, 4A:
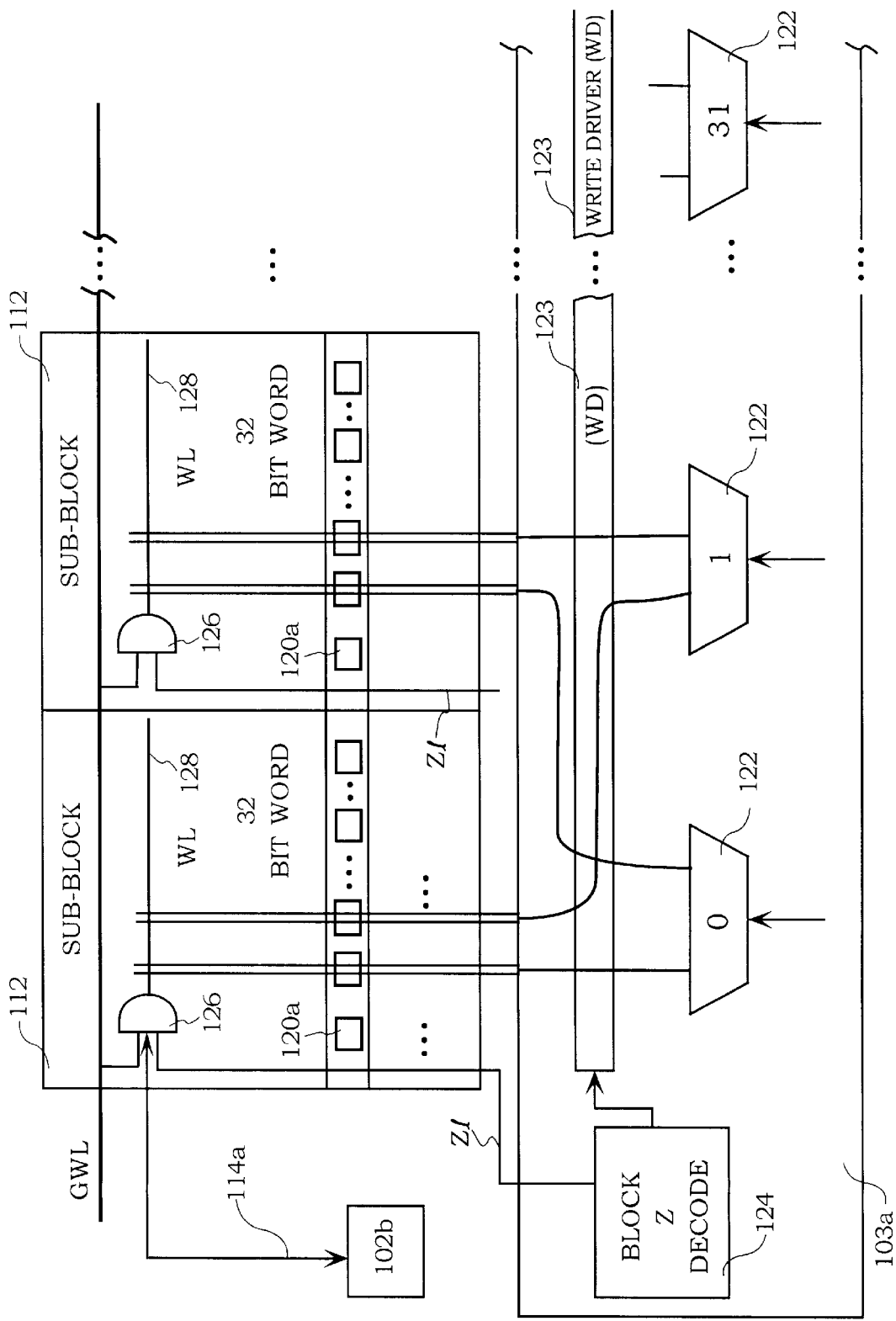

For example, FIG. 4A-1 illustrates a portion of the maintenance port 103a and simplified versions of a sub-block 112. Traversing each of the sub-blocks 112 is a global wordline (GWL). The GWL is coupled to a logical AND gate 126 which is also coupled to a Z decode line (Zl). The output of the AND gate 126 is a local wordline 128 for each sub-block 112. In this embodiment, the sub-block is 32-bits in width and also includes a valid bit 120a. For completeness, a pair of exemplary bitlines are drawn vertically across each of the sub-blocks 112 and coupling to the local wordline 128. Thus, the AND gate 126 is configured to activate only one local wordline 128 depending upon the signals provided to the respective AND gates 126 which are coupled between Z decode lines (Zl). As will be illustrated in greater detail with reference to FIG. 7D, the Z decode line Zl will be individually provided to each sub-block 112 by way of its own associated sub-block control (SBC) 354 as shown in FIG. 7C.

One exemplary block Z decode 124 is shown receiving the interlock signal 114a from the search port 102b. The block Z decode 124 will therefore be able to select the correct sub-block 112 at the correct timing that does not interfere with a next search cycle and also selects the correct write driver 123. As shown, inverse multiplexers 122 are provided within the maintenance port 103a and are configured to communicate with the bitlines of the individual sub-blocks 112. In a preferred embodiment, the maintenance port 103a will include 32 inverse multiplexers 122 in order to appropriately select the correct bitlines of the sub-blocks 112. In this manner, data can be written onto the bitlines at the appropriate time which does not interfere with a search operation.

In contrast, conventional techniques provide data to the bitlines and the wordline is turned on at about the same time the data is provided. When the bitline differential is established, data can be written to the selected location. In one embodiment of the present invention, the bitline differential is established ahead of time during a search operation, so when the local wordline 128 is selected, the write will instantly occur without the differential delay of the prior art. In this manner, the next search can proceed and the data will already be established in the cell. Generally, the search port 102b will perform search operations at the beginning of a clock cycle, followed by the search's precharge operation. During the time that the search precharge is occurring, a read or a write operation can be performed.

Thus, while a search operation is in process, data is applied onto the bitlines so that when the search is complete, the read or write operation can be performed. For instance, when the system clock goes high, a new search begins and the local wordline 128 is turned off. Accordingly, a search operation will happen in every clock cycle, and while the search is precharged, the write operation can be performed. Communication between the search port 102b and the maintenance port 103a is thus established by the interlock signal 114a.

FIG. 4A-2 illustrates an alternate embodiment of FIG. 4A-1, in which the interlock signal 114a is not communicated to the block Z decode 124. Instead, the interlock signal is communicated to the AND gate 126 to provide the timing. For example, GWL and Zl is each setup during a search and the interlock signal 114a is provided to AND gate 126 to generate WL only when not searching. It should be appreciated that this alternate implementation enables tighter timing margins.

Figures 1, 4B:
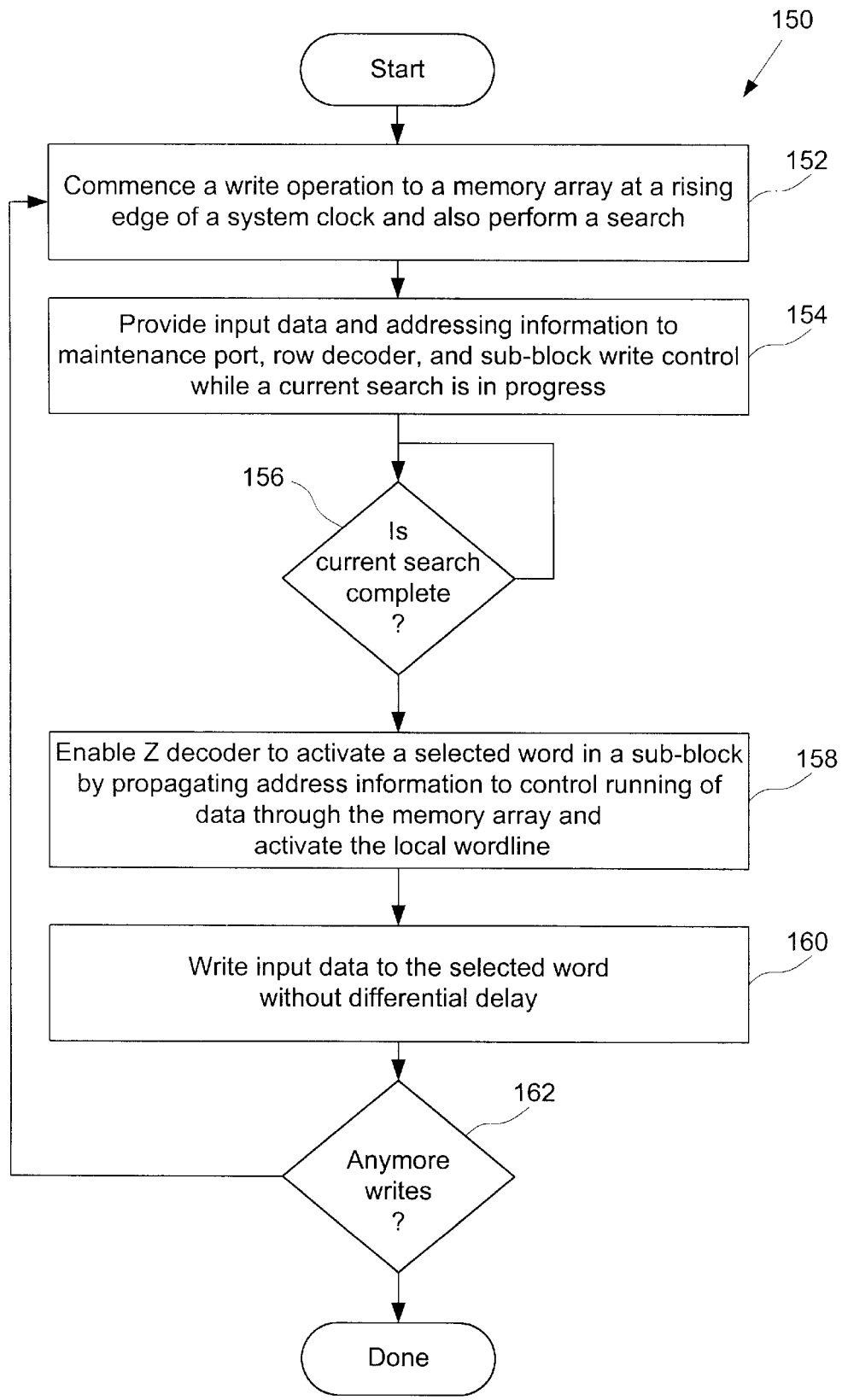
Figures 2, 4B:
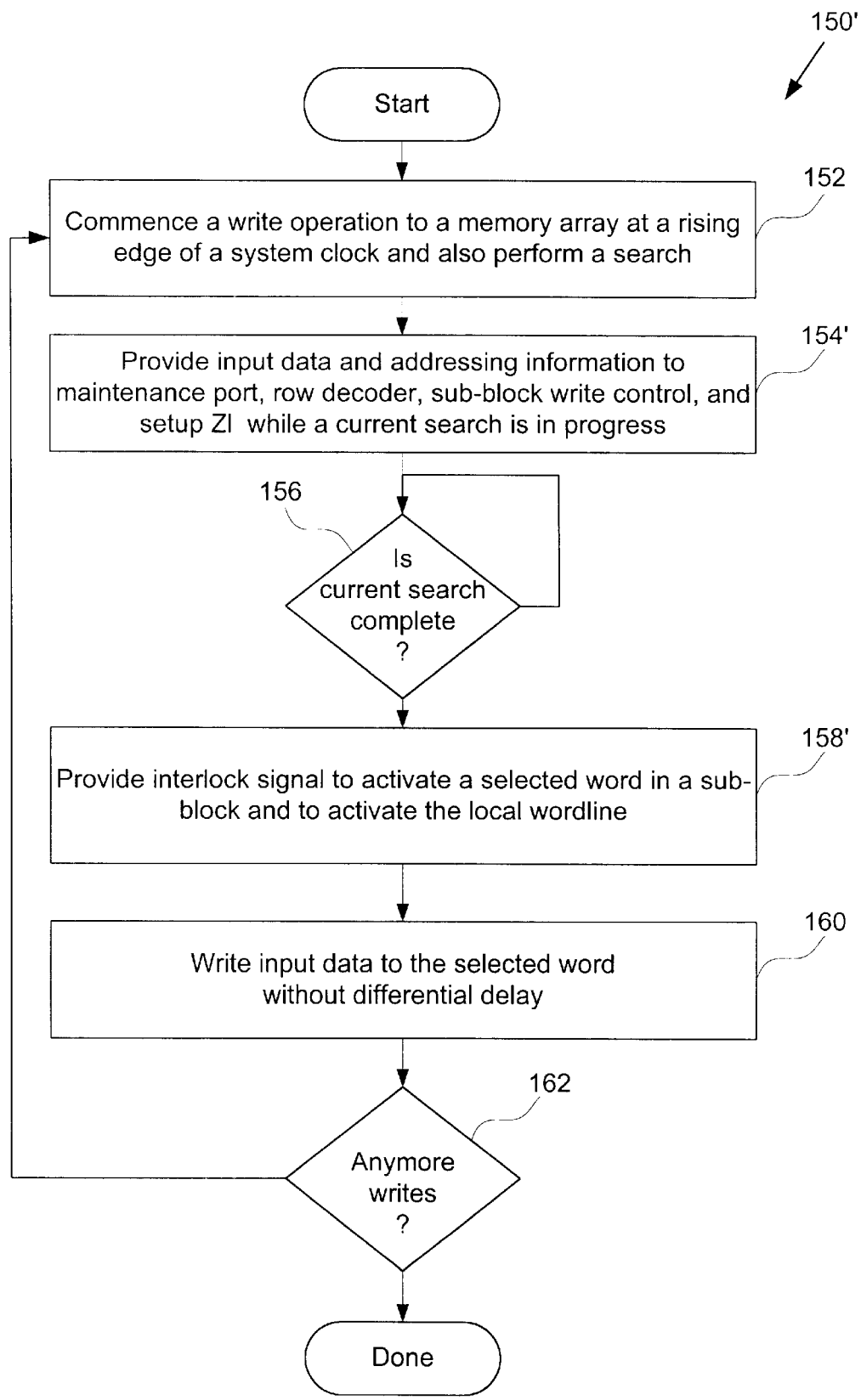

To illustrate in greater detail the operations performed to complete a write operation without disturbing continuous searching by the search port, the flowchart 150 for FIG. 4B-1 is provided. The method begins at an operation 152 where a write operation is commenced to a memory array at a rising edge of a system clock. At the same time, a search operation will also commence at the rising edge of the system clock. From operation 152, the method proceeds to operation 154 where input data and addressing information is provided to the maintenance port, row decoder, and sub-block write control while a current search is in progress.

For example, at the rising edge of the system clock, the data is provided to the bitlines so that the bitlines will be ready to write the data when the wordline is selected. The sub-block write control is configured to indicate which sub-block will be addressed using the block Z decode of FIG. 4A-1. Accordingly, while the search is in progress, the data will be sitting at the bitlines until instructed to write when the wordline is selected. In operation 156, it is determined whether the current search is complete. If it has not been completed, the writing operation will be delayed until the search is complete. When the search is complete, this will mean that the interlock signal 114a has been received from the search port 102a.

The method now moves to operation 158 where the Z decoder is enabled to activate a selected word in a sub-block by propagating address information to control the running of data through the memory array and activate the local wordline. As mentioned above, a logical AND operation will be performed between the global wordline GWL and the Z decode line in order to select the appropriate sub-block and thus, the appropriate local wordline for writing. The method now moves to operation 160 where the input data is written to the selected word without any differential delay. In operation 162, it is determined whether anymore writes are desired to sub-blocks of the CAM memory array. If there are, the method will move once again to operation 152 where another write operation is commenced to a memory array at the rising edge of the system clock and also, a next search will be performed. It is important to note that the search operations are occurring independently one per cycle, even when a write operation is occurring simultaneously by way of the maintenance port. The search port will thus provide the maintenance port an indication by way of the interlock signal 114a of when it is appropriate to write the data onto a selected address of the memory array.

In FIG. 4B-2, a flowchart 150' is provided to illustrate the alternative embodiment of FIG. 4A-2. In this embodiment, operations 154 and 158 have been modified as operations 154' and 158'. Specifically, in operation 154', the operation of setting up Zl is also performed. In operation 158', the interlock signal 114a is provided to activate a selected word in a sub-block to activate the local wordline. The remainder of this method proceeds as does the method of FIG. 4B-1.

Figure 4C:
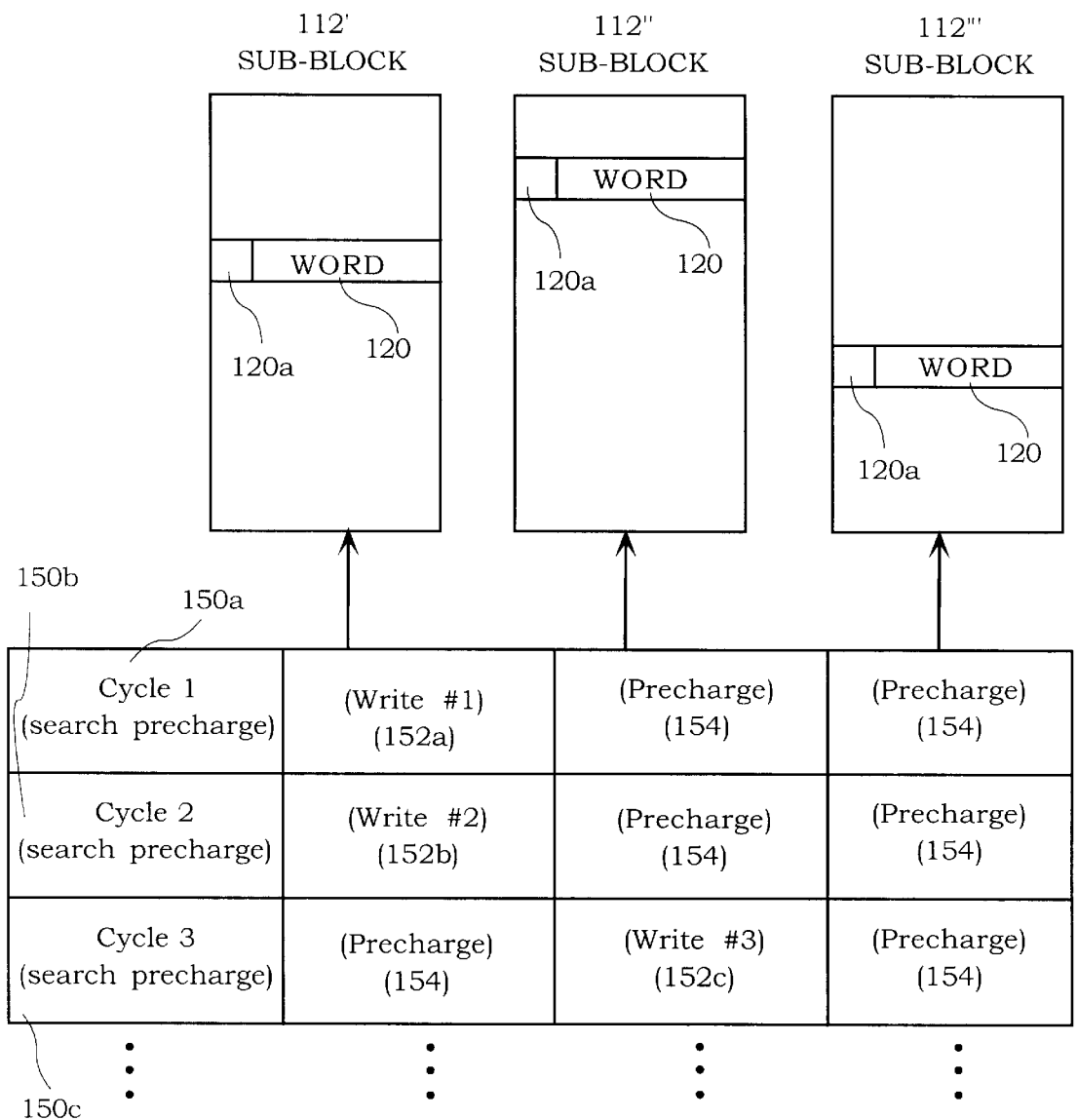
FIG. 4C illustrates a simplified diagram of a plurality of sub-blocks, in accordance with one embodiment of the present invention.

To further describe the writing process, FIG. 4C illustrates a simplified diagram of a plurality of sub-blocks 112', 112", and 112'". Also shown are three exemplary cycles in which writes operations are performed to selected ones of the sub-blocks 112. In cycle 1 150a, a search will be performed at the rising edge of a system clock. During cycle 1, the search operation will precharge, thus allowing a write operation #1 152a to occur to sub-block 112'. During this time, the bitlines for sub-block 112" and 112'" will be in precharge 154. In the next cycle, another search will occur and the write operation #2 152b will be setup by providing data to the bitlines for when the search precharge operation occurs. During the search precharge operation of cycle 2, the write operation #2 152b will occur to sub-block 112'. At this time, the bitlines for sub-block 112" and sub-block 112'" will be in precharge.

During a cycle 3 150c, a write operation #3 152c will be setup for sub-block 112". During the search precharge period, the write operation #3 152c will actually occur to the sub-block 112". During this time, the bitlines for sub-block 112' and 112'" will be in precharge 154. As illustrated, a write operation can be performed one cycle after another as shown with regard to cycles 1 and 2 in which write operations 1 and 2 were performed to sub-block 112'. The bitlines for sub-block 112' do not have to go into precharge because the write drivers will just write new data onto the bitlines and then perform the write operation during the precharge of the search operation. Conventionally, after each write operation, there is a need to precharge the bitlines before performing a write. However, in this embodiment, it is possible to consecutively perform writes to bitlines without the need to precharge. In addition, FIG. 4C illustrates how search operations are continuously performed, one for each cycle, even when write operations are being performed to selected sub-blocks 112 to setup future searches.

Figures 1, 5A:
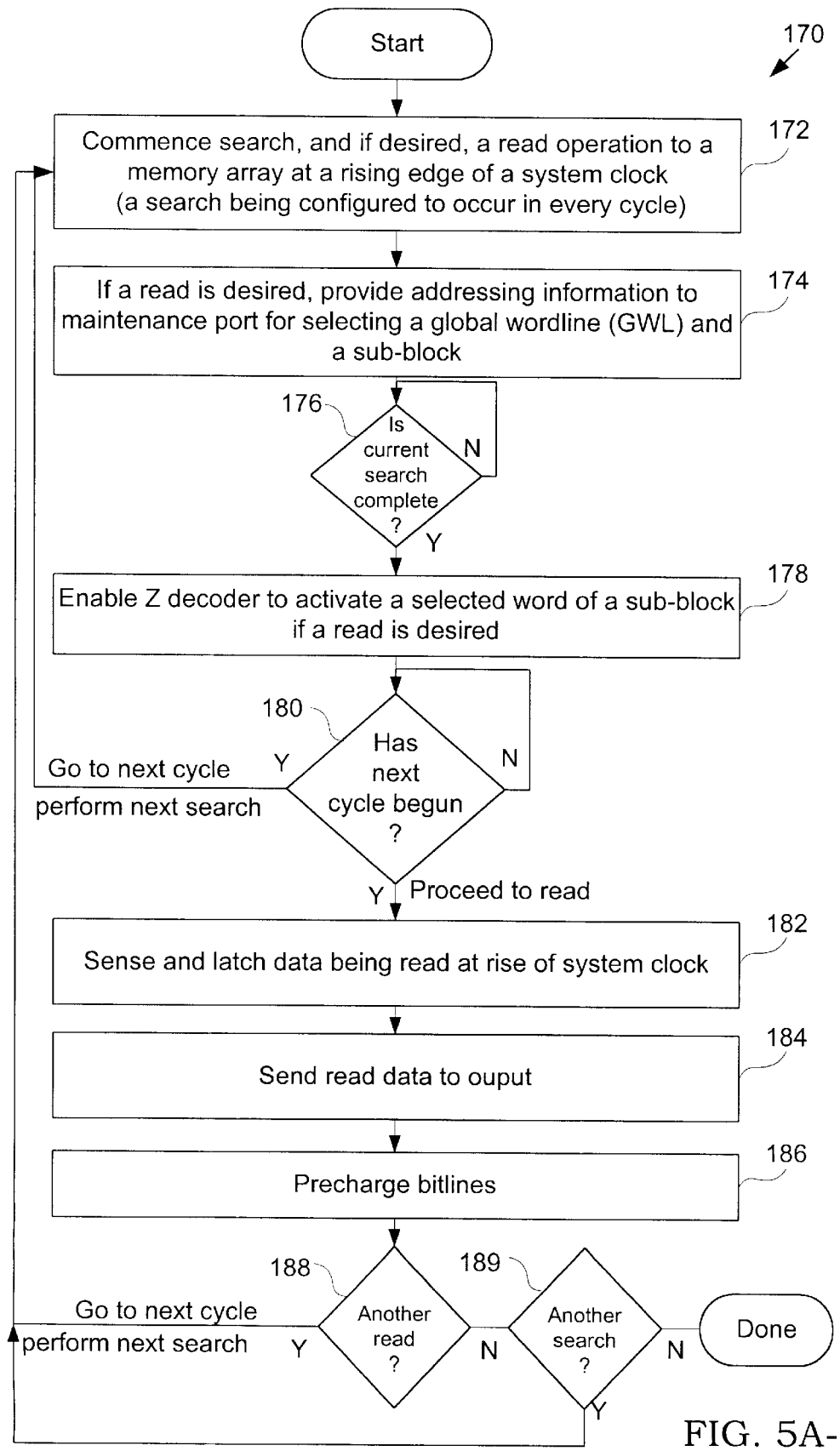
Figures 2, 5A:
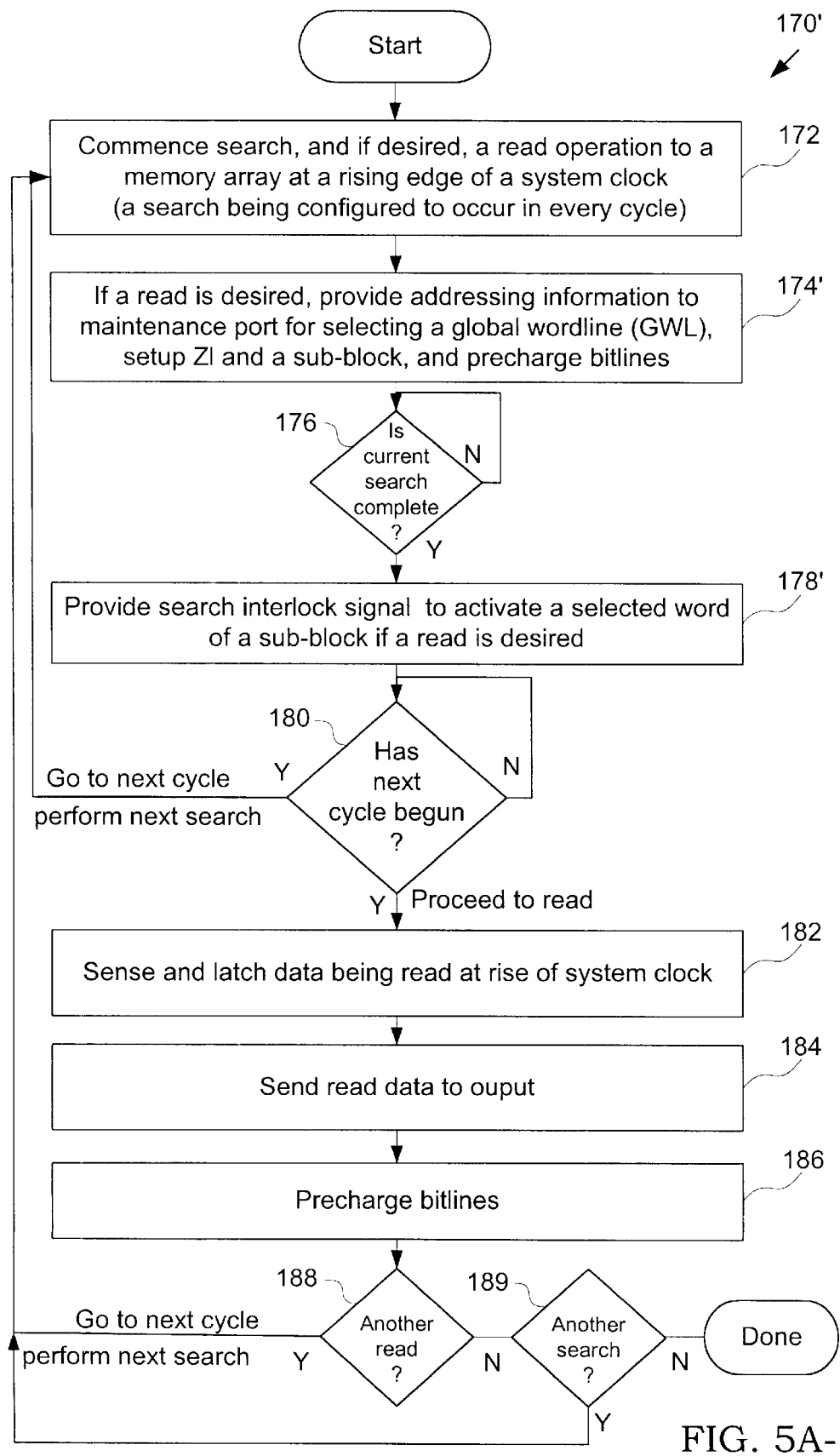

FIG. 5A-1 is a flowchart diagram 170 illustrating the method operations performed during read operations by way of the maintenance port and continuous search operations by way of the search port, in accordance with one embodiment of the present invention. The method begins at an operation 172 where a search is commenced and if desired, a read operation to a memory array at a rising edge of the system clock is also commenced. As mentioned earlier, a search operation will be configured to occur in every cycle. Thus, the method will proceed to operation 174 where, if a read is desired, addressing information is provided to the maintenance port for selecting the global wordline (GWL) and a sub-block. Bitline precharge is also enabled to setup conditions for read, and recover from a write in the previous cycle. Once the addressing information has been provided, the method proceeds to decision operation 176 where it is determined if the current search has been completed. If it has not, the method will wait until the current search is completed. Otherwise, the method will move to operation 178.

In operation 178, the Z decoder is enabled to activate a selected word for a sub-block if a read is desired. As mentioned earlier, the Z decoder enables the selection of a single word of a selected sub-block. In general, the enabling of the Z decoder enables the local wordline, and turns off the precharge so the cell can generate differential onto the bitlines for sensing. In operation 180, it is determined whether the next cycle has begun. If the next cycle has begun, the method will proceed simultaneously to the next cycle where a next search will be performed in operation 172, and to operation 182 where the data being read is sensed and latched at the rising edge of the system clock. If another read operation was not to be performed in operations 172, 174 through 178, then the search port will still continue performing its search during each cycle regardless of whether a read operation or a write operation is being performed. Thus, the sensing and latching of the data being read is performed in a second cycle during operation 182, and then the method proceeds to operation 184 where the read data is sent to the output and the bitlines are precharged in operation 186.

If another read is determined to be performed in operation 188, the method will again proceed to operation 172 where the next read operation can be commenced and the next search is also begun. If it is determined that another read is not to be performed, then the method will proceed to operation 189 where it is determined whether another search is desired. If another search is desired, the method will also proceed to operation 172 where the search will be performed independently from the read operation (and the write operation). In either case, it should be appreciated that a reading operation is actually performed over two cycles. During a first cycle, the addressing of the desired data to be read is performed, while in a next cycle the data is sensed and propagated to the output. However, during both the first and second cycles of the read operation, search operations are performed. FIG. 5A-2 illustrates a flowchart 170' which defines an alternative implementation in which operations 174 and 178 have been modified as operations 174' and 178'. In operation 174', if a read is desired, the addressing information is provided to the maintenance port for selecting a global wordline (GWL), Zl, and a sub-block, and the bitlines are precharged. In this embodiment, the bitlines are precharged to recover from a write operation in the previous cycle and to setup conditions for read operations. In operation 178', the interlock signal is provided to activate a selected word of a sub-block if a read is desired.

It should also be noted that if two consecutive read operations are to be performed, during a first cycle, addressing information is provided to the selected data to be read while in the second cycle, the read data is sensed, latched, and propagated to the output. During the sensing of the data read during the first cycle, different data can also be addressed during the second cycle while the sensing was being performed for the data addressed during the first cycle. This feature will be described in greater detail with reference to FIG. 5B below.

Figure 5B:
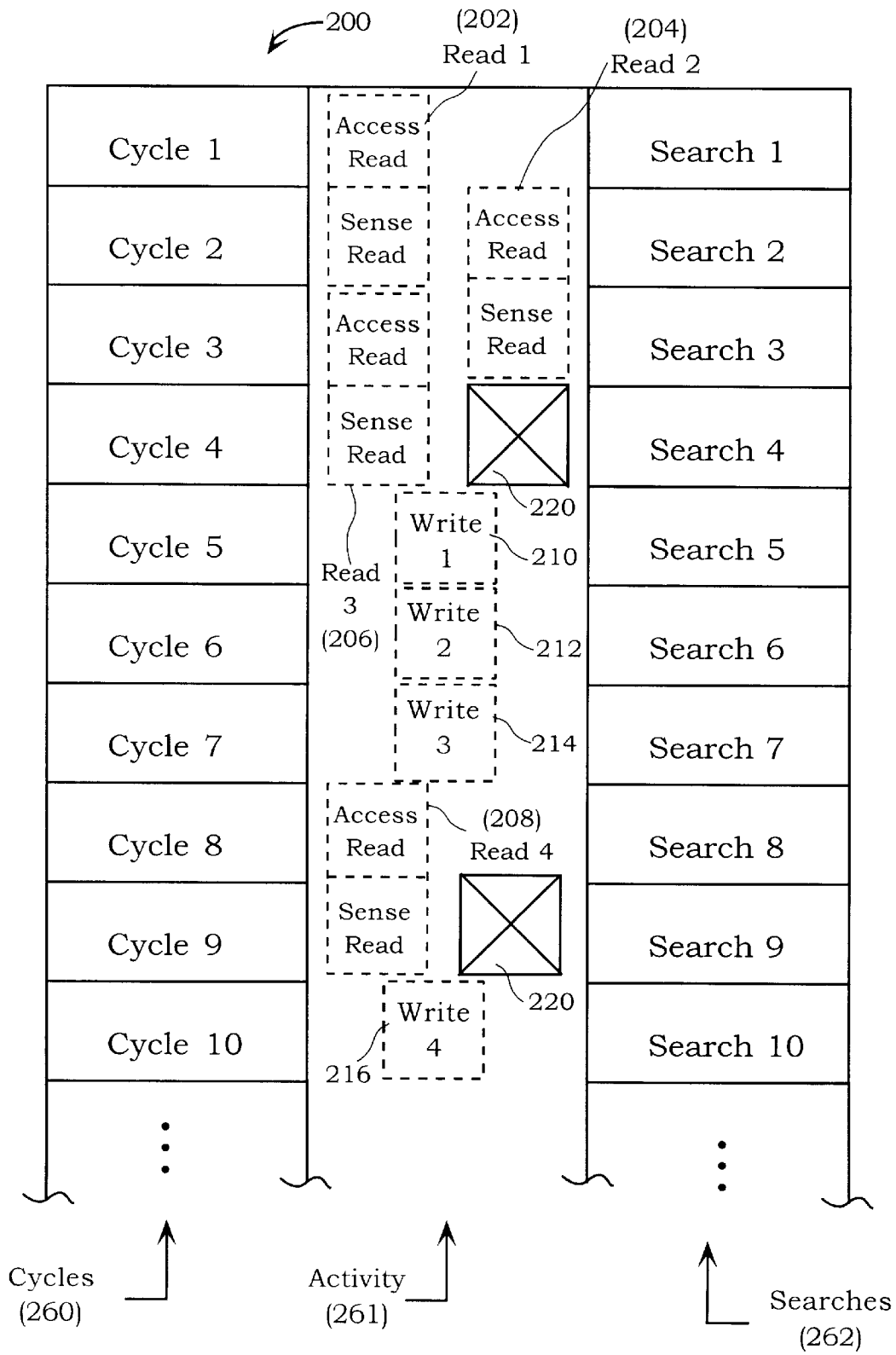
FIG. 5B is a diagram illustrating a plurality of consecutive cycles 1 through 10, and illustrating how searches are performed during each cycle, in accordance with one embodiment of the present invention.

FIG. 5B is a diagram 200 illustrating a plurality of consecutive cycles 1 through 10, and illustrating how searches are performed during each cycle, in accordance with one embodiment of the present invention. As such, during each of the cycles 260, searches 262 will occur and activity 261 will occur without interrupting the search operations being performed by the search port. The activity 261 is being performed by the maintenance port 103a. As mentioned above, the search port 102a and the maintenance port 103a are in communication with each other by way of an interlock signal that informs the maintenance port when search operations are complete. In this example, a read-1 202 will be performed at the beginning of cycle 1 and search 1. Read-1 202 will first perform an access operation to provide the addressing information to the maintenance port.

During a cycle 2, the read operation 202 will perform the sensing of the read data while the second search operation is being performed. Simultaneously, it may be desired to perform a second read-2 204 which begins by performing the access operation described above. The accessing operation will be performed during cycle 2 and during search 2. The sensing of the access data will not occur until cycle 3 during the third search. Thus, each read operation is actually performed during two cycles. A third read operation, read-3 206, can also be performed during cycle 3 where the accessing portion of the read operation is performed. During the accessing operation, a search 3 will be performed along with the sensing of the data for the second read 204.

In cycle 4, the data read in cycle 3 for read-3 206 will be sensed while search 4 is occurring. At this point, it may be desired to perform a write-1 210 after performing the read-3 206. As mentioned above, a write operation is performed during one cycle as opposed to read operations which require two cycles. As a result, cycle 4 will be a dead cycle 220 while search operation 4 is being performed by the search port. In cycle 5, the write-1 210 operation can be performed at the same time that search 5 is being performed (e.g., during the search precharge). A write-2 212 can then be performed during cycle 6 when the sixth search is being performed. Similarly, during cycle 7, a write-3 214 can be performed during the seventh search.

At this point, the example shows that a read operation, read-4 208, is desired and will commence in cycle 8 where the access portion of the read operation is performed during the eighth search. In cycle 9, the access data is sensed to complete the read-4 operation 208, however, a dead cycle 220 will occur during the ninth search, since a write operation, write-4 216, is to be performed in cycle 10 when the tenth search is being performed. As can be appreciated from this illustration, read operations can be performed in succession so long as a read operation follows a read operation. When a write operation follows a read operation, a dead cycle will occur since the write operation is a single cycle operation.

Figure 5C:
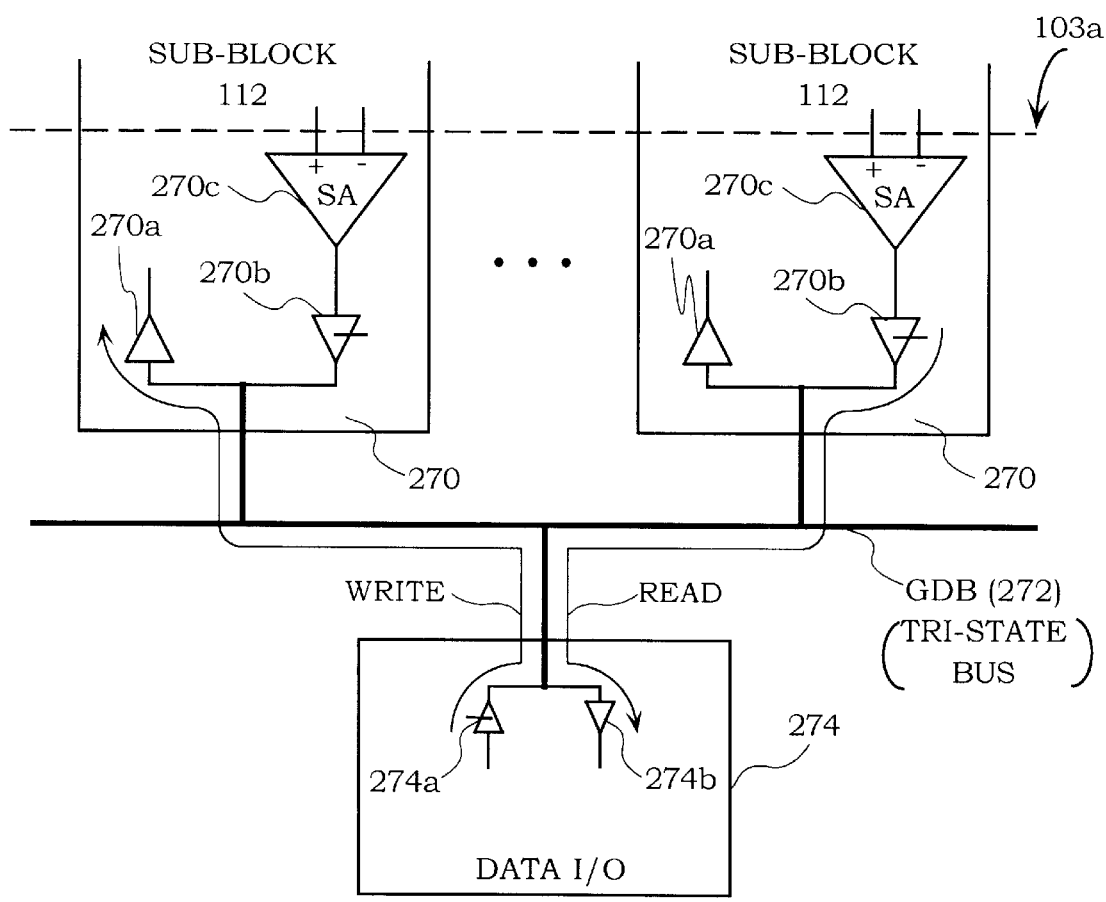
FIG. 5C shows a more detailed diagram of a global data bus (GDB), in accordance with one embodiment of the present invention.

FIG. 5C shows a more detailed diagram of a global data bus (GDB) 272, in accordance with one embodiment of the present invention. The GDB 272 is preferably a tri-state bus, and as such, is a latched bus. In this example, circuitry 270 is provided for each of the sub-blocks 212 interfaced with the maintenance port 103a. The circuitry 270 is shown including a sense amplifier 270c that couples up to a tri-state buffer 270b. During a read operation, the data is sensed by the sense amplifier 270c and provided to the tri-state buffer 270b. As shown in the exemplary read operation, the data is provided by way of the tri-state buffer 270b which communicates the data onto the global data bus (GDB) 272. The data provided to the global data bus (GDB) 272 is then communicated to a data I/O 274 and to a buffer 274b.

During a write operation, the data I/O will be configured to provide the data to be written by way of a tri-state buffer 274a. From 274a, the data is provided to the global data bus 272 and then to the selected circuitry 270, that communicates with the sub-block 212. During the write operation, the data is fed through a buffer 270a as shown for ease of illustration. Accordingly, one skilled in the art will notice that only one sub-block 212 or the data I/O 274 can drive the bus at one time. So, on a write operation, the data is applied from the outside to the data I/O block 274. This data then gets written onto the global data bus 272 and the selected sub-block 112 propagates the data onto the bitlines. During a read operation, the data I/O is no longer driving the bus, but a given sub-block 112 is performing the driving of the global data bus 272. The read data is then propagated onto the global data bus 272 and passed through the buffer 274b of the data I/O 274. As mentioned above, the sensing of the data during a read operation occurs during a second cycle, and therefore, writing cannot be performed by way of the global data bus, thus creating the dead cycle 220 described with reference to FIG. 5B. More specifically, the global data bus 272 is a shared bus and read cycles will occupy the bus for two cycles while the write operations will only occupy the bus for one cycle.

Figure 6A:
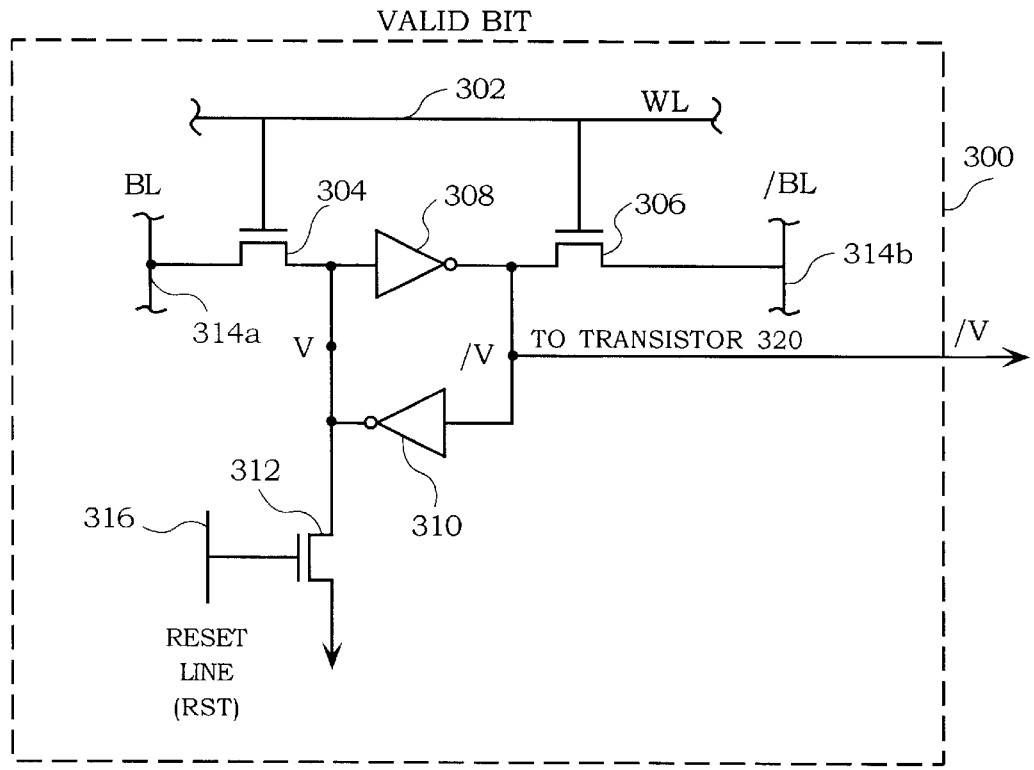
FIGS. 6A and 6B illustrate the functionality of a valid bit, in accordance with one embodiment of the present invention.
Figure 6B:
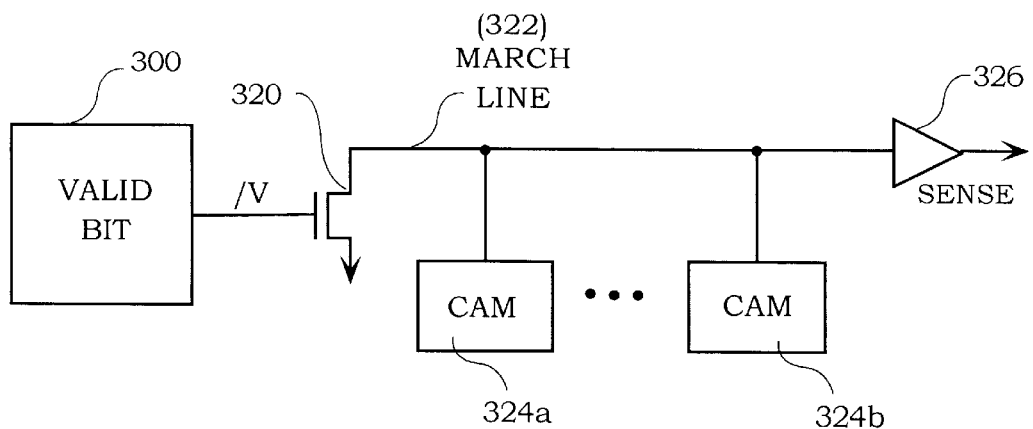

FIGS. 6A and 6B illustrate the functionality of a valid bit 300, in accordance with one embodiment of the present invention. The valid bit 300 is shown having a pair of access transistors 304 and 306 connected to the wordline 302. The access transistors 304 and 306 are also coupled to the bitlines 314a and 314b, and an inverter 308. The inverter 308 is one of a cross coupled inverter pair that includes inverter 310 and 308. Also provided is a re-set transistor 312 which has its gate connected to a re-set line 316. Therefore, a valid bit voltage "v" is produced at the output of inverter 310 and the input of inverter 308, while a valid bit voltage "/v" is produced at the output of inverter 308 and the input of inverter 310. Valid bit /v is thus communicated to force a miss on the corresponding match line. In operation, when a re-set line goes HI, the transistor 312 will turn on, thus pulling down the voltage of valid bit "v" to 0 which thus produces a 1 at valid bit /v. Therefore, by driving the re-set line 316 HI, a miss is forced since the valid bit 300 will be an invalid bit.

FIG. 6B illustrates how the valid bit 300 is coupled to a transistor 320 and thus, to a match line 322. The match line 322 couples to CAM cells 324a up to 324n. The match line is also shown connected to a sense amplifier 326. Accordingly, the valid bit 300 will be replicated once per every word in a CAM array. As described above, the valid bit 300 was referred to valid bit 120a. The match line 322 is essentially a wired NOR and is precharged HI. If the valid bit is re-set by way of the re-set line 316, the valid bit 300 will produce a logical 1 for valid bit /v. This communicates a logical HI to the gate of the transistor 320, thus bringing down the match line to 0. This will ensure that a miss is detected for the valid bit 300. In general, any time a write is performed to an entry (i.e., data is updated), the valid bit v is set to logical 1 such that the match line 322 is not pulled to 0. This will ensure that the particular word is included in the search. It is important to note that the re-set operation performed by way of re-set line 316 does not in any way interfere with the search operation which is configured to be performed once every cycle, that is to say the re-set operation is delayed by the search port interlock signal so that the valid bits are not reset until the current search operation has completed.

Figures 7A, 7B:
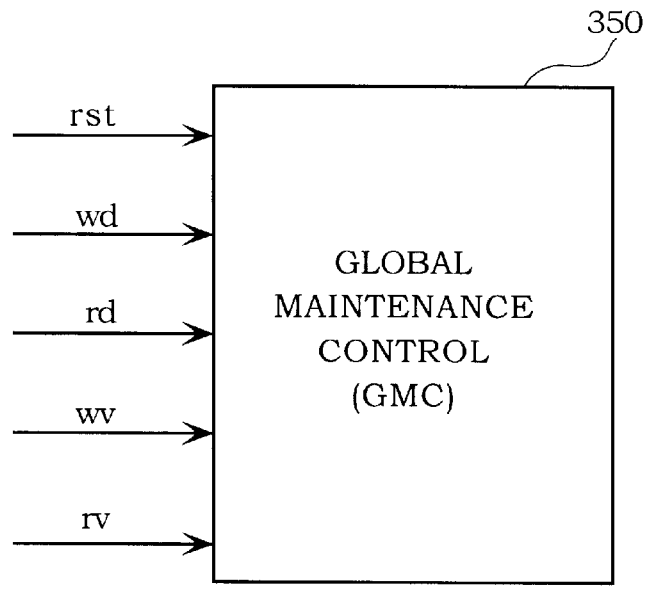
FIGS. 7A and 7B illustrate the general operation of a global maintenance control (GMC), in accordance with one embodiment of the present invention.
Figure 7C:
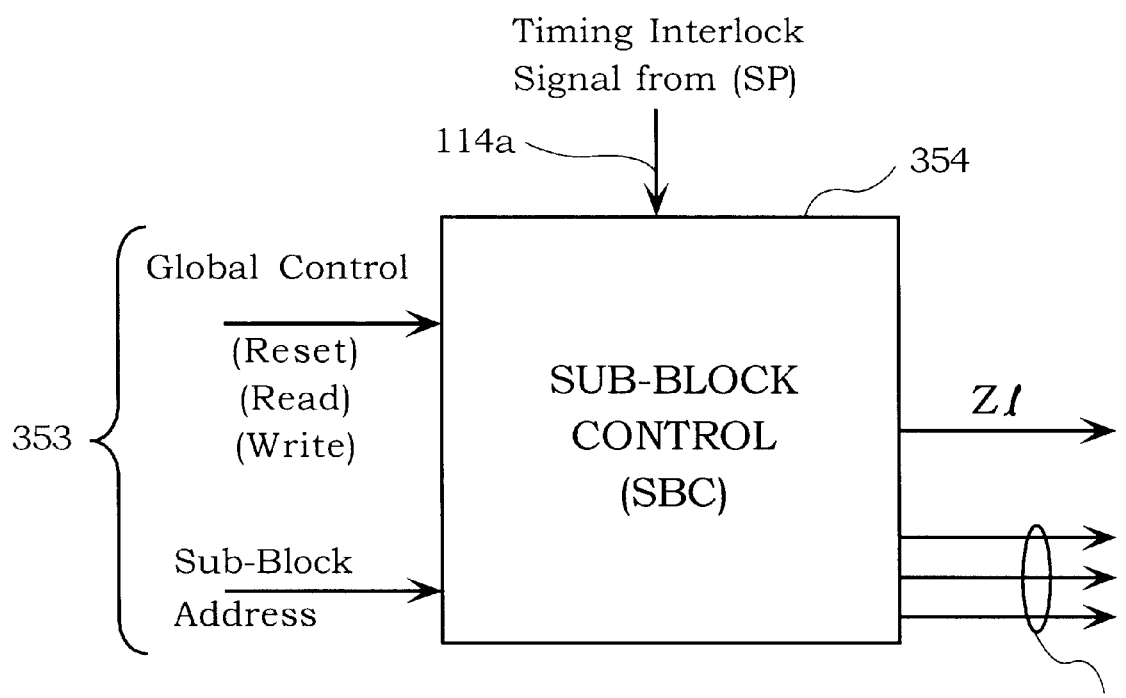
FIG. 7C illustrates a block diagram of a sub-block control (SBC), in accordance with one embodiment of the present invention.

FIGS. 7A and 7B illustrate the general operation of a global maintenance control (GMC) 350 in accordance with one embodiment of the present invention. One GMC 350 will be provided for every core 104 of a CAM macro. As described above with reference to FIG. 3, a single GMC 350 will be included as part of the maintenance port 103a. Thus, the GMC 350 will service 8 sub-blocks that are part of the core 104. The GMC 350 is shown receiving inputs for a re-set signal (rst), a write data (wd), a read data (rd), a write valid (wv), and a read valid (rv). As shown in FIG. 7B, the signals rst, wd, rd, wv, and rv are shown in a truth table corresponding with a re-set operation, a write operation, and a read operation.

It should be noted that it is possible to independently write data to the data portions of a word as well as to a valid bit. In a like manner, it is also possible to independently read data from the valid bit and the word data. Additionally, it is also possible to simultaneously read data from both the valid bit and the data portion of a word, as well as write data to both the valid bit and the data portion of the word. In one embodiment, it is therefore possible to overwrite the data in the data section of a word while the valid bit remains valid. Of course, if a read was just performed in a prior cycle, the write operation has to be performed one cycle later, since read cycles are two cycles long and write cycles are a single cycle long.

Figure 7D:
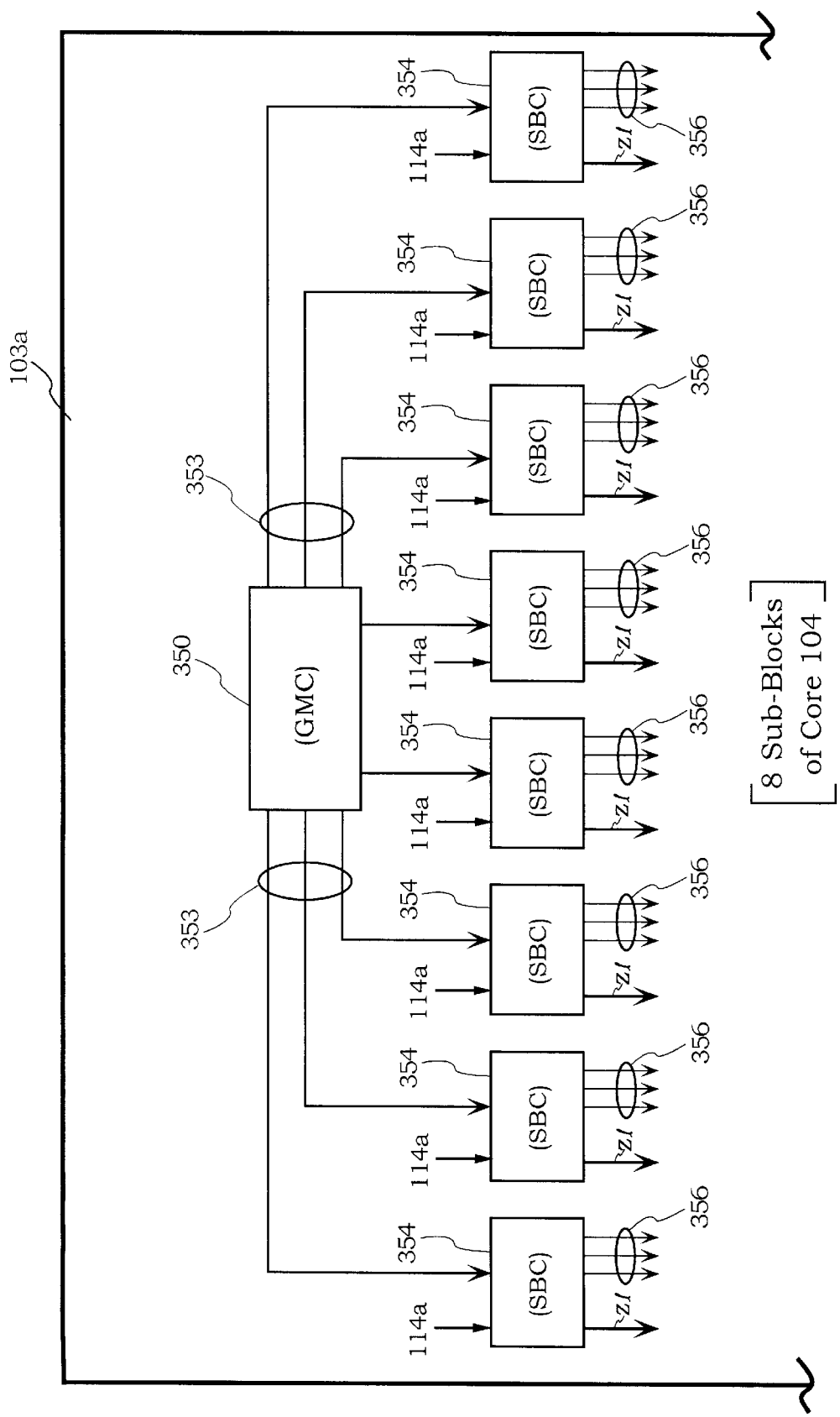
FIG. 7D illustrates the replication of the SBC for each sub-block and the use of one GMC for each core, in accordance with one embodiment of the present invention.

FIG. 7C illustrates a block diagram of a sub-block control (SBC) 354, in accordance with one embodiment of the present invention. The SBC 354 is shown receiving global control signals for performing re-set operations, read operations, and write operations, as well as sub-block addressing operations. These signals 353 are communicated to the SBC 354 along with the timing interlock signal 114a that is received from the search port. The SBC 354 is then configured to provide the Z decode signal (Zl). In one embodiment of the present invention, the sub-block control (SBC) 354 is configured to be replicated once for each sub-block in a core 104. As shown in FIG. 7D, the SBC 354 is replicated eight times and is configured to interface with eight sub-blocks of the core 104.

The GMC 350 described above with reference to FIG. 7A, will then provide the signals 353 discussed above to each of the SBCs 354. Each SBC 354 will also receive its associated timing interlock signal 114a from the search port 102a. Each SBC 354 is also configured to generate control signals 356 to each of the sub-blocks of the core 104. The control signals 356 include a sense amplifier control, a write driver control, and a precharge control. Depending on which sub-block of the eight sub-blocks is being accessed, only one Zl signal will be provided to activate the local wordlines of the selected sub-block.

Figure 8A:
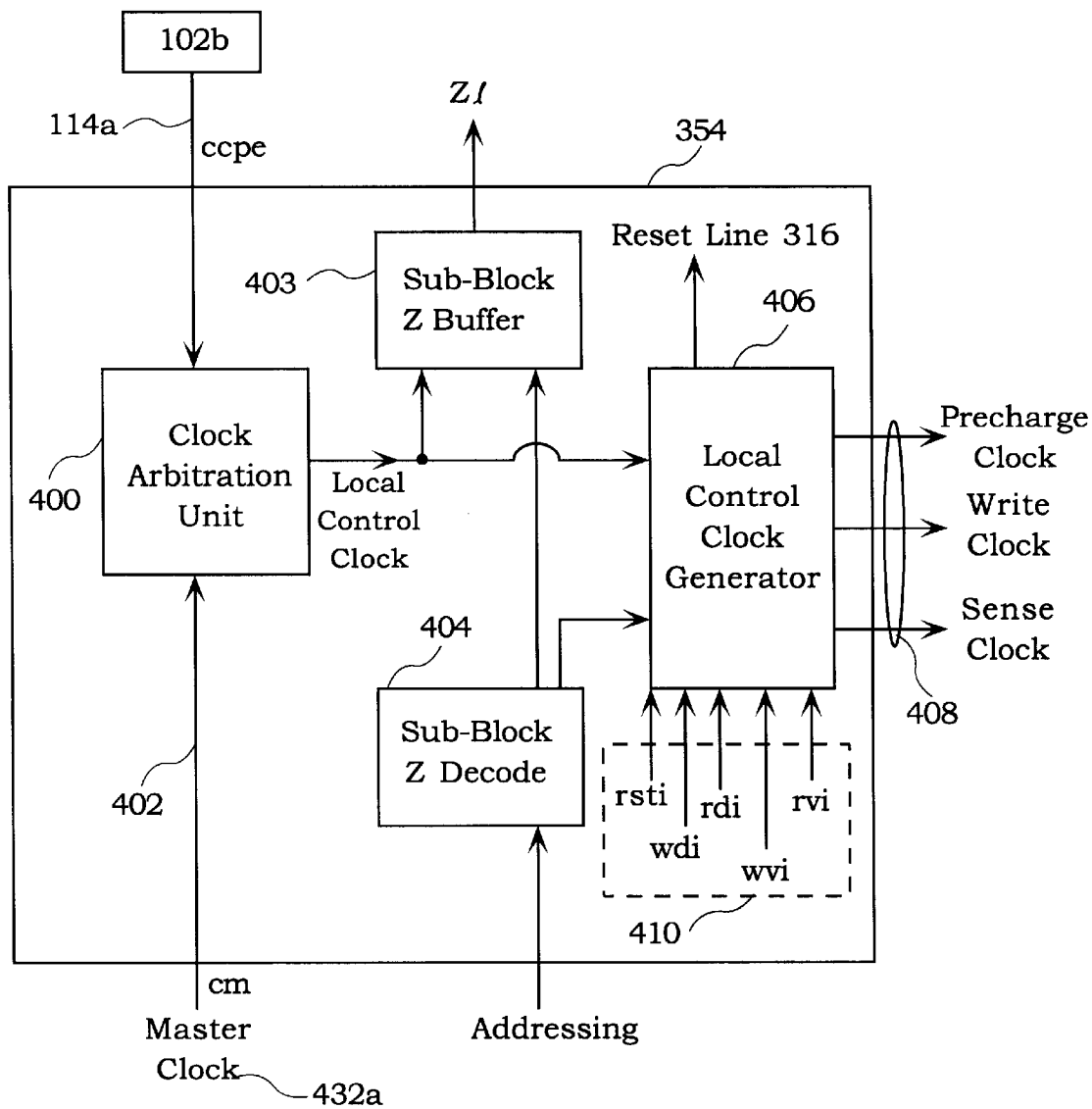
FIGS. 8A and 8B show more detailed diagrams of the sub-block control (SBC) of embodiments of the present invention.

FIG. 8A shows a more detailed diagram of the sub-block control (SBC) 354 of the present invention. In this embodiment, the SBC is shown receiving the timing interlock signal 114a from the search port 102b. The timing interlock signal (also referred to as ccpe) is provided to a clock arbitration unit 400 that also receives a master clock signal (also referred to as cm) 402. The clock arbitration unit 400 will then generate a local control clock that is shown communicated to both a sub-block Z buffer 403 and a local control clock generator 406. Addressing information is provided to a sub-block Z decode 404 which then communicates the Z decode information to the sub-block Z buffer 403. The sub-block Z buffer 403 will then generate the Z decode signal Zl that is provided to the selected sub-block of the core 104.

Figure 8B:
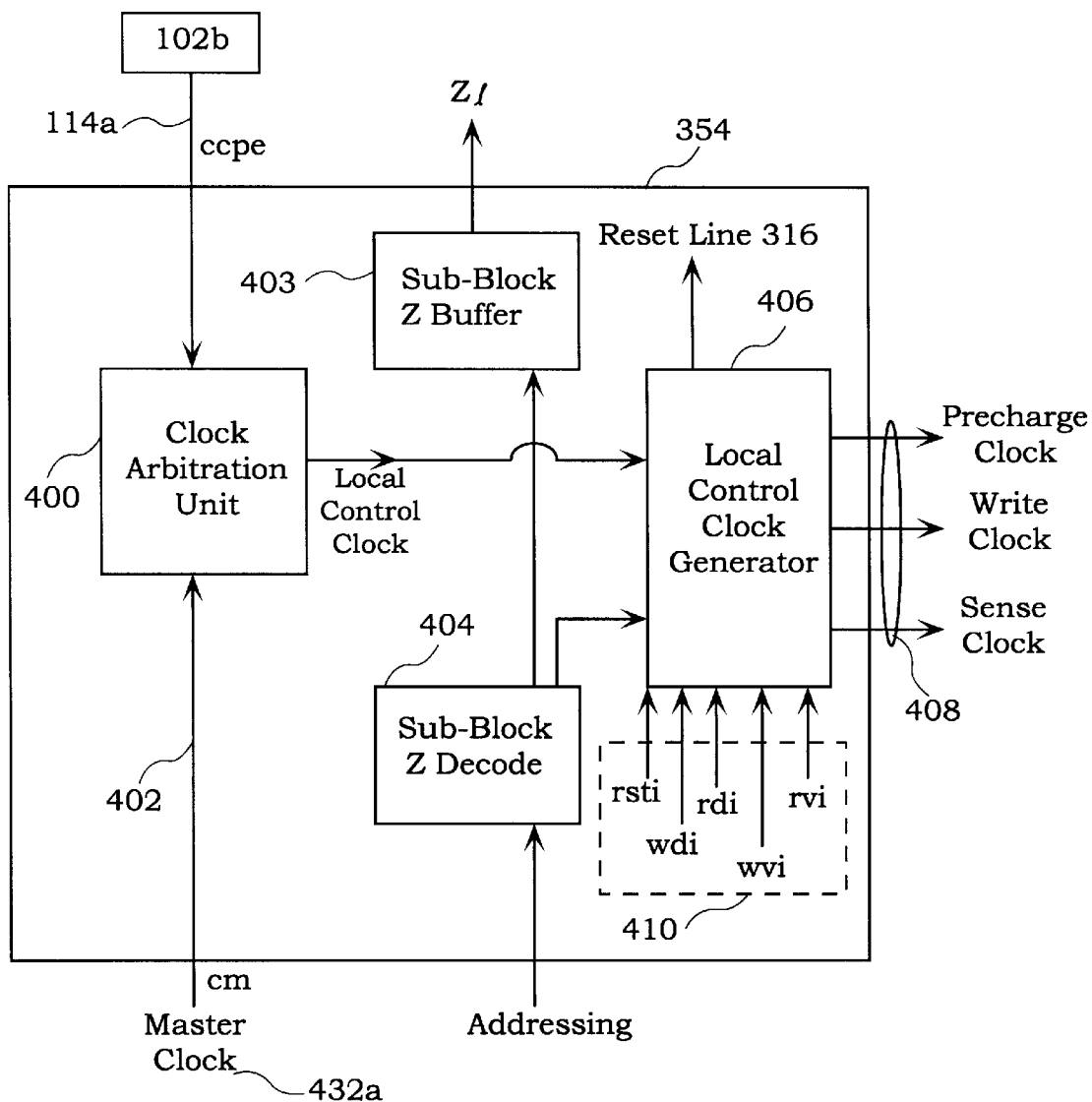

The local control clock generator 406 is shown receiving 410 signals rsti, wdi, rdi, wvi, and rvi. These signals 410 represent signals provided from the global maintenance control (GMC) 350. The local control clock generator 406 will then produce a precharge clock, a write clock, and a sense clock defined as signals 408. The local control clock generator 406 is also configured to generate a reset line 316 to perform the reset of valid bits. That is, to gate rsti with local clock to delay reset of valid bits until completion of search. As will be understood by one skilled in the art, the signals 408 are replicated as necessary for all of the data and valid data. In an alternative embodiment, FIG. 8B does not provide the local control clock to the sub-block Z buffer 403 since the interlock signal 114a will provide the necessary timing. Thus, Zl will not be gated with the local control block since ccpe will gate WL generation in an AND operation of ccpe, Zl, and GWL.

Figure 9:
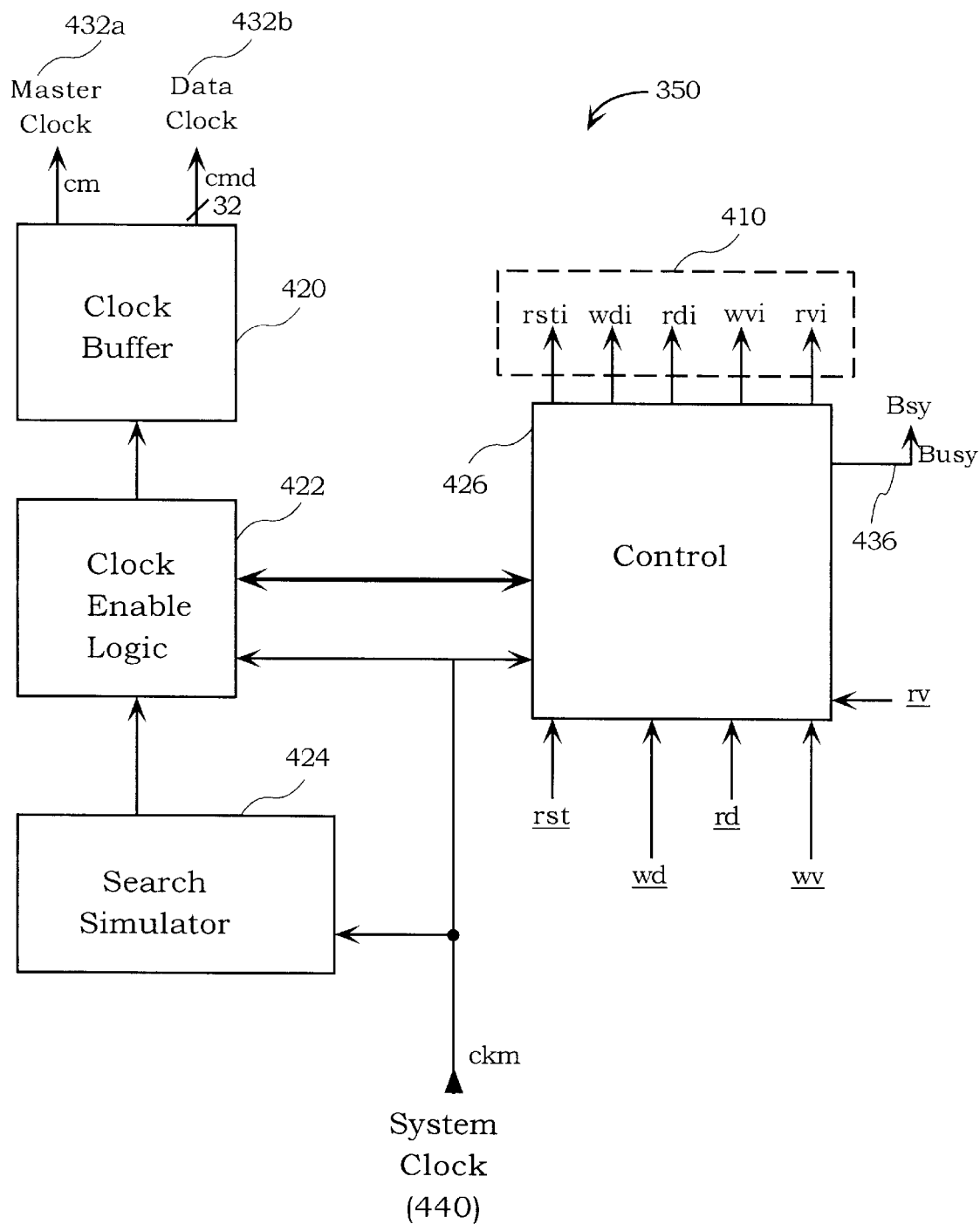
FIG. 9 illustrates in more detail the global maintenance control (GMC), in accordance with one embodiment of the present invention.

FIG. 9 illustrates in more detail the global maintenance control (GMC) 350, in accordance with one embodiment of the present invention. The GMC 350 includes a control circuit 426 which is configured to generate the signals 410 described with reference to FIG. 8A. The system clock (also referred to as ckm) 440 is shown communicated to a search simulator 424, clock enable logic 422 and control circuitry 426. The search simulator 424 is provided as a back-up to simulate repetitive searching that is performed by the search port. For instance, if the search port is deselected and no search operation is performed, the maintenance port operations will still be performed at appropriate timing intervals as if the search operations had been continued one after another.

The search simulator couples to the clock enable logic 422 which then couples to the clock buffer 420. Clock buffer 420 is configured to generate the master clock (cm) 432a described with reference to FIG. 8A, data clock (cmd) which is a 32-bit bus, and a valid bit clock. As described with reference to FIG. 8A above, the master clock 432a is configured to interface with the timing interlock signal 114a (ccpe) coming from the search port. The data clock 432b will be provided to each data I/O bit in a word and can handle tri-state control for writing operations. Likewise, the valid bit clock will be provided to the valid bit I/O. The data clock 432b is also configured to enable the data latches of FIG. 5C. So, if wd is HI, the data clock (cmd) will turn on the tri-state buffer and allow the data to be transferred to the global data bus.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Additionally, the various block diagrams may be embodied in any form which may include, for example, any suitable computer layout, semiconductor substrate, semiconductor chip or chips, printed circuit boards, packaged integrated circuits, or software implementations (and combinations thereof). Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A content addressable memory, comprising:
   a search port for performing search operations at each clock cycle;
   a maintenance port for writing and reading data to address locations of the content addressable memory; and
   an interlock signal being communicated from the search port to the maintenance port to establish when writing and reading of data is to be performed to the content addressable memory so that the search operations continue uninterrupted at each clock cycle.

2. A content addressable memory as recited in claim 1, wherein the interlock signal is communicated at an end of a search operation and at a beginning of one of a search pre-charge operation and a recovery phase.

3. A content addressable memory as recited in claim 2, wherein the maintenance port is configured to set-up a writing operation at a beginning of a clock cycle and execute the write operation at the end of the search operation and the beginning of the search pre-charge operation.

4. A content addressable memory as recited in claim 2, wherein the maintenance port is configured to access an address of data during a first cycle of a read operation and sense and latch the data at the address during a second cycle of the read operation.

5. A content addressable memory as recited in claim 4, wherein search operations are performed by the search port during both the first read cycle and the second read cycle.

6. A content addressable memory as recited in claim 1, wherein the content addressable memory includes at least one macro, the at least one macro includes a plurality of cores, and each core includes the maintenance port, the search port, and the interlock signal.

7. A content addressable memory as recited in claim 6, wherein each core includes a column of words, and each word includes a valid bit.

8. A content addressable memory as recited in claim 6, wherein each core includes a row decoder and a priority encoder.

9. A content addressable memory as recited in claim 1, wherein the search port and the maintenance port correspond to a plurality of sub-blocks, each sub-block defining a column of words of a memory array; and
   the maintenance port including a plurality of sub-block control (SBC) units, each of the SBC units being configured to receive the interlock signal from the search port and produce a Z decode signal (Zl), the Z decode signal (Zl) being configured to activate a local wordline of a selected one of the plurality of sub-blocks.

10. A content addressable memory as recited in claim 9, wherein each of the SBC units further being configured to generate a sense amplifier control signal, a write driver control signal, and a pre-charge control signal.

11. A content addressable memory as recited in claim 9, wherein each of the SBC units includes a clock arbitration unit, the clock arbitration unit being configured to receive the interlock signal directly from the search port and a master clock signal, the clock arbitration unit being configured to generate a local control clock that is communicated to a sub-block Z buffer and a local control clock generator.

12. A content addressable memory as recited in claim 11, wherein the local control clock generator is configured to generate at least a pre-charge clock, a write clock, and a sense clock.

13. A content addressable memory as recited in claim 11, wherein the Z decode signal (Zl) is output from the sub-block Z buffer of the SBC unit.

14. A content addressable memory as recited in claim 9, wherein the maintenance port further includes a global maintenance control that is configured to communicate global control reset signals, global control read signals, global control write signals, and sub-block addressing to each of the SBC units.

15. A content addressable memory as recited in claim 14, wherein the global maintenance control includes a search simulator for simulating searches in case the search port fails to operate, a clock enable logic, a clock buffer, and control circuitry, the control circuitry being configured to generate read data, write data, read valid, write valid, reset, and busy signals.

16. A content addressable memory as recited in claim 15, wherein the clock buffer is configured to generate a master clock, a data clock, and valid bit clock, the master clock being communicated to a clock arbitration unit within each SBC unit.

17. A two port content addressable memory comprising:
   a maintenance port;
   a search port;
   a plurality of sub-block memory columns being defined between the maintenance port and the search port; and
   an interlock signal configured to be communicate d from the search port to the maintenance port to signal when reads and writes are to be performed by the maintenance port without interrupting the search port from executing a search operation on every clock cycle during a desired search operation.

18. A two-port content addressable memory as recited in claim 17, wherein the interlock signal is communicated at an end of a search operation and at a beginning of a search pre-charge operation.

19. A two-port content addressable memory as recited in claim 18, wherein the maintenance port is configured to set-up a writing operation at a beginning of a clock cycle and execute the write operation at the end of the search operation and the beginning of the search pre-charge operation.

20. A two-port content addressable memory as recited in claim 18, wherein the maintenance port is configured to access an address of data during a first cycle of a read operation and sense and latch the data at the address during a second cycle of the read operation.

21. A two-port content addressable memory as recited in claim 20, wherein search operations are performed by the search port during both the first read cycle and the second read cycle.

22. A content addressable memory, comprising:
a search port for performing search operations;
a maintenance port for writing and reading data to address locations of the content addressable memory; and
an interlock signal being communicated from the search port to the maintenance port to establish when writing and reading of data is to be performed to the content addressable memory without interrupting search operations that can be triggered at each clock cycle.

23. A content addressable memory as recited in claim 22, wherein the interlock signal is communicated at an end of a search operation and at a beginning of one of a search pre-charge operation and a recovery phase.

24. A content addressable memory as recited in claim 23, wherein the maintenance port is configured to set-up a writing operation at a beginning of a clock cycle and execute the write operation at the end of the search operation and the beginning of the search pre-charge operation.

25. A content addressable memory as recited in claim 23, wherein the search port for performing search operations is configured to be deselected.

26. A content addressable memory chip, comprising:
a first macro including a first set of N cores;
a second macro including a second set of N cores;
a first maintenance port integrated to a first side of the first set of N cores;
a second maintenance port integrated to a first side of the second set of N cores;
a first search port integrated to a second side of the first set of N cores;
a second search port integrated to a second side of the second set of N cores;
a first set of N interlock signals, one for each core of the first set of N cores, the first set of N interlock signals being integrated from the first search port to the first maintenance port to signal when reads and writes are to be performed to selected ones of the first set of N cores, the reads and writes configured to be performed without interrupting consecutive searches by the first search port; and
a second set of N interlock signals, one for each core of the second set of N cores, the second set of N interlock signals being integrated from the second search port to the second maintenance port to signal when reads and writes are to be performed to selected ones of the second set of N cores, the reads and writes configured to be performed without interrupting consecutive searches by the second search port.

27. A content addressable memory chip, comprising:
a first macro including a first set of 8 cores;
a second macro including a second set of 8 cores;
a first maintenance port integrated to a first side of the first set of 8 cores;
a second maintenance port integrated to a first side of the second set of 8 cores;
a first search port integrated to a second side of the first set of 8 cores;
a second search port integrated to a second side of the second set of 8 cores;
a first set of 8 interlock signals, one for each core of the first set of 8 cores, the first set of 8 interlock signals being integrated from the first search port to the first maintenance port to signal when reads and writes are to be performed to selected ones of the first set of 8 cores, the reads and writes configured to be performed without interrupting consecutive searches by the first search port; and
a second set of 8 interlock signals, one for each core of the second set of 8 cores, the second set of 8 interlock signals being integrated from the second search port to the second maintenance port to signal when reads and writes are to be performed to selected ones of the second set of 8 cores, the reads and writes configured to be performed without interrupting consecutive searches by the second search port.

* * * * *

UNITED STATES PATENT AND TRADEMARK OFFICE
CERTIFICATE OF CORRECTION

PATENT NO. : 6,339,539 B1 Page 1 of 1
APPLICATION NO. : 09/651426
DATED : January 15, 2002
INVENTOR(S) : G. F. Randall Gibson and Radu Avramescu It is certified that error appears in the above-identified patent and that said Letters Patent is hereby corrected as shown below:

Column 3:
line 50, replace "illustrates" with --illustrate--.

Column 10:
line 23, replace "212" with --112--.

Signed and Sealed this

Twenty-eighth Day of October, 2008

JON W. DUDAS
*Director of the United States Patent and Trademark Office*